United States Patent [19]
Kimura

[11] Patent Number: 5,920,124
[45] Date of Patent: Jul. 6, 1999

[54] SEMICONDUCTOR DEVICE HAVING MISALIGNMENT RESISTIVE INTERCONNECT LAYERS

[75] Inventor: Hiroshi Kimura, Tokyo, Japan

[73] Assignee: Mitsubishi Denki Kabushiki Kaisha, Tokyo, Japan

[21] Appl. No.: 08/862,255

[22] Filed: May 23, 1997

[30] Foreign Application Priority Data

Jan. 22, 1997 [JP] Japan .................................. 9-009495

[51] Int. Cl.⁶ .............................. H01L 23/48; H01L 23/52
[52] U.S. Cl. ........................ 257/774; 257/301; 257/775; 257/734
[58] Field of Search ................................ 257/774, 775, 257/776, 734, 758, 759, 760, 797, 798, 906, 340, 387, 301

[56] References Cited

U.S. PATENT DOCUMENTS

| | | | |
|---|---|---|---|
| 5,336,917 | 8/1994 | Kohyama | ................................. 257/301 |
| 5,409,855 | 4/1995 | Jun . | |
| 5,489,546 | 2/1996 | Ahmad et al. . | |
| 5,492,849 | 2/1996 | Park . | |

FOREIGN PATENT DOCUMENTS

| | | |
|---|---|---|
| 4-130722 | 5/1992 | Japan . |
| 5-13434 | 1/1993 | Japan . |
| 5-75060 | 3/1993 | Japan . |
| 7-235594 | 9/1995 | Japan . |
| 8-46173 | 2/1996 | Japan . |

*Primary Examiner*—Carl Whitehead, Jr.
*Attorney, Agent, or Firm*—Oblon, Spivak, McClelland, Maier & Neustadt, P.C.

[57] ABSTRACT

A semiconductor device having a structure of at least two interconnect levels is disclosed wherein word lines as a lower interconnect layer are not removed if a misalignment exists when contact holes are formed. The word lines (2) serving as gate electrodes are arranged on a surface of a p-type Si substrate (14) serving as a base. An etching stopper underlay insulative film (10) is formed over the word lines (2), and an etching stopper film (9) is formed to cover the etching stopper underlay insulative film (10). An interlayer insulative film (8) and bit lines (1) are deposited on the etching stopper film (9), and a hole is formed. A sidewall insulative film (16) is formed on a side surface of the hole. The etching stopper film (9) functions to prevent part of the word lines (2) which is located in the hole from being removed.

5 Claims, 37 Drawing Sheets

SEMICONDUCTOR DEVICE HAVING MISALIGNMENT RESISTIVE INTERCONNECT LAYERS

BACKGROUND OF THE INVENTION

1. Field of the Invention

The present invention relates to a semiconductor device and a method of fabricating the same. More particularly, the present invention relates to the production of contact holes in a semiconductor device having a multi-level interconnection structure.

2. Description of the Background Art

An example of conventional methods of producing contact holes in a semiconductor memory device disclosed in Japanese Patent Application Laid-Open No. 5-75060 (1993) is illustrated in FIGS. 60 through 63. FIGS. 60 through 63 are cross-sectional views showing respective steps of the fabrication of such a semiconductor memory device. FIG. 60 is a cross-sectional view showing bit lines exposed because of misalignment in the lithographic process. FIG. 61 is a cross-sectional view showing the step of etching the bit lines and an insulative film of FIG. 60 to provide an opening of a vertical cross-sectional configuration. FIG. 62 is a cross-sectional view showing the step of removing a resist pattern shown in FIG. 61 to provide sidewalls. FIG. 63 is a cross-sectional view showing the step of providing a charge accumulation electrode, a capacitor insulative film and a plate electrode on the structure of FIG. 62.

In FIGS. 60 through 63, the reference character 1P designates a bit line; 3P designates a charge accumulation electrode; 4P designates a plate electrode; 5P designates an opening; 8P designates a first insulative film; 13P designates a field $SiO_2$ film; 14P designates a p-type semiconductor substrate; 15P designates a capacitor insulative film serving as an insulative film when the charge accumulation electrode 3P and the plate electrode 4P form a capacitor; 16P designates a second insulative film for preventing electrical continuity between the charge accumulation electrode 3P and the bit lines 1P; 17P designates a resist pattern; and 34 designates an $n^+$ diffusion layer.

The conventional method of producing the contact holes in the semiconductor memory device is described below with reference to FIGS. 60 through 63.

Referring to FIG. 60, a 200 nm width of the bit line 1P is shown as exposed due to misalignment in the lithographic process. First, the $SiO_2$ films 13P are formed on the p-type semiconductor substrate 14P by the LOCOS technique as shown in FIG. 60. Then, a switching transistor and the bit lines 1P are formed. The $n^+$ diffusion layer 34 serves as the source/drain of the switching transistor in the structure of FIG. 60. Using the resist pattern 17P as a mask, the first insulative film 8P is selectively removed by anisotropic etching to form the opening 5P therein for electrical connection between the charge accumulation electrode 3P and the $n^+$ diffusion layer 34. During this process, the bit line 1P is exposed in the opening 5P due to mask misalignment.

With reference to FIG. 61, using the resist pattern 17P as a mask, the exposed part of the bit line 1P is etched away. Thereafter, a part of the first insulative film 8P which has been under the exposed part of the bit line 1P is etched away. The opening 5P of a vertical cross-sectional configuration is then provided.

As illustrated in FIG. 62, the resist pattern 17P is removed after the opening 5P is formed. The second insulative film 16P made of high-temperature CVD silicon oxide is deposited and then etched back by overetching to form sidewalls.

The charge accumulation electrode 3P made of polycrystalline silicon, the capacitor insulative film 15P made of silicon oxy-nitride, and the plate electrode 4P made of polycrystalline silicon are formed as shown in FIG. 63.

In the semiconductor memory device having a one-level interconnection structure, as above described, the opening 5P of the vertical cross-sectional configuration may be formed because of the step of etching the exposed part of the bit line 1P if a great width of the bit line 1P is exposed during the formation of the opening 5P, and the short-circuit between the charge accumulation electrode 3P and the bit lines 1P may be prevented because of the step of providing the second insulative film on the side surface of the opening 5P.

The contact hole forming process in the method of fabricating the semiconductor device disclosed in Japanese Patent Application Laid-Open No. 5-75060 may prevent the short-circuit between the charge accumulation electrode 3P and the bit lines 1P when the interconnect layer includes a one-level metal interconnection.

The semiconductor memory device constructed as above described has drawbacks to be described below.

The dominating memory cell structure to which stacked storage nodes of recent dynamic RAMs are applied are a COB (capacitor over bitline) structure wherein a capacitor is provided over the bit lines 1P. When contact holes are formed in the application of the storage nodes, two interconnect layers, that is, word lines (transfer gates) and bit lines are present as a lower layer. The COB structure is a dynamic RAM cell structure wherein the stacked capacitor overlies the bit lines for structural reasons and the gate electrode immediately overlies the silicon substrate, with an insulative film therebetween, for functional reasons. The memory cells of conventionally used dynamic RAMs have been of a CUB (capacitor under bitline) construction. The CUB structure is in the form of a simple stacked capacitor (comprised of a single thin film of polycrystalline silicon) and thus is easy to process. The bit lines which are difficult-to-process metal interconnect wires are positioned as high as possible, and an interlayer insulative film is flattened. Then, the metal interconnect wires are processed over the CUB.

Recently, the COB structure wherein the capacitor is formed over the bit lines has been increasingly employed to increase the capacitor area (increase the capacitor capacitance) since advanced processing technology has enabled the metal interconnect wires to be used as the lower layer to increase the degree of freedom. The device microprocessing rules have been stricter year after year, but the need to increase the capacitor capacitance has been growing. In the CUB structure, the area of the storage nodes must be small to allow for the partial removal of the bit line contacts after the formation of the storage nodes. However, in the COB structure wherein the contact holes are not formed in the memory cells after the formation of the storage nodes, the storage nodes may be formed while making the most possible use of the minimum processing dimension rules, permitting the increase in area of the storage nodes. It has also been reported that the COB structure provides a greater (vertical) distance between the bit lines and the cell plate and a lower parasitic capacitance of the bit lines.

The method of fabricating the semiconductor device disclosed in Japanese Patent Application Laid-Open No. 5-75060 describes the formation of the contact holes for the storage nodes without any consideration for the word lines when the two interconnect layers including the word lines and bit lines are used.

In the above described background art method, the contact holes may be formed so as to prevent the short-circuit between the charge accumulation electrode 3P and the bit lines 1P when only one metal interconnect layer including the bit lines 1P is provided since the second insulative film 16P is formed between the charge accumulation electrode 3P and the bit lines 1P. However, Japanese Patent Application Laid-Open No. 5-75060 does not disclose the semiconductor device having the two-level interconnection structure, for example, including the word lines under the bit lines, and is not simply applied to the production of the contact holes in the semiconductor device having the two-level interconnection structure. This is because simple partial removal of the word lines, like the bit lines, can result in significant losses of transistor characteristics since the width of the word lines specifies a transistor gate width.

Additionally, a great misalignment of the formed opening 5P causes the bit lines 1P to be removed in great amount to thin the bit lines 1P, resulting in disconnection and wiring resistance errors.

In this fashion, the method disclosed in Japanese Patent Application Laid-Open No. 5-75060 may be applied only to the semiconductor device having the one-level interconnection structure and presents wiring errors and wiring resistance errors of the bit lines 1P. It has therefore been desired to attain two objects: to enable the application of the method of fabricating the semiconductor device to the production of the contact holes of the semiconductor device having at least two interconnect levels, and to suppress wiring errors due to thinning of the bit lines.

SUMMARY OF THE INVENTION

According to a first aspect of the present invention, a semiconductor device having a structure of at least two interconnect levels comprises: a semiconductor substrate serving as a base; a first interconnect wire provided above a surface of the semiconductor substrate; an etching stopper film provided over the first interconnect wire for covering at least an upper surface of the first interconnect wire; a second interconnect wire provided above the etching stopper film; a hole formed above the surface of the semiconductor substrate by etching; the second interconnect wire and the etching stopper film having parts located in the hole, the parts of the second interconnect wire and the etching stopper film being removed by the etching; the first interconnect wire having a part located in the hole, the part of the first interconnect wire remaining unremoved by the etching; and a sidewall insulative film provided on a side surface of the hole.

Preferably, according to a second aspect of the present invention, the semiconductor device of the first aspect further comprises: an underlay insulative film provided on a lower surface of the etching stopper film.

Preferably, according to a third aspect of the present invention, in the semiconductor device of the second aspect, a part of the underlay insulative film which is located in the hole is removed by the etching.

Preferably, according to a fourth aspect of the present invention, in the semiconductor device of the second aspect, the second interconnect wire includes a plurality of interconnect wires arranged at a predetermined pitch; and the width of the plurality of interconnect wires is increased up to a size which permits the spacing between the plurality of interconnect wires to be less than the diameter of the hole.

Preferably, according to a fifth aspect of the present invention, in the semiconductor device of the first aspect, the semiconductor device includes a dynamic RAM; the hole is filled with a storage node for a capacitor; and the first interconnect wire and the second interconnect wire are a word line and a bit line, respectively.

A sixth aspect of the present invention is intended for a method of fabricating a semiconductor device having a structure of at least two interconnect levels. According to the present invention, the method comprises the steps of: preparing a semiconductor substrate serving as a base; forming a first interconnect wire above a surface of the semiconductor substrate; forming an etching stopper film over the first interconnect wire; forming a second interconnect wire above the etching stopper film; forming a hole above the surface of the semiconductor substrate by etching; the second interconnect wire and the etching stopper film having parts located in the hole, the parts of the second interconnect wire and the etching stopper film being removed by the etching in the step of forming the hole; the first interconnect wire having a part located in the hole, the part of the first interconnect wire remaining unremoved by the etching in the step of forming the hole; and forming a sidewall insulative film on a side surface of the hole.

Preferably, according to a seventh aspect of the present invention, in the method of the sixth aspect, the step of forming the hole comprises the steps of: performing first etching to expose the second interconnect wire and the etching stopper film in the hole; and performing second etching to simultaneously remove the parts of the second interconnect wire and the etching stopper film which are exposed in the hole.

Preferably, according to an eighth aspect of the present invention, in the method of the seventh aspect, the first etching is silicon oxide plasma etching having a high selectivity for a silicon nitride film.

Preferably, according to a ninth aspect of the present invention, the method of the sixth aspect further comprises the step of: forming an underlay insulative film over the first interconnect wire immediately prior to the step of forming the etching stopper film, the underlay insulative film serving as an underlay film for the etching stopper film.

Preferably, according to a tenth aspect of the present invention, in the method of the ninth aspect, a part of the underlay insulative film which is located in the hole is removed by the etching in the step of forming the hole.

In accordance with the first aspect of the present invention, the contact hole may be formed in the semiconductor device having the structure of two or more interconnect levels, and transistor characteristics may be prevented from deteriorating due to removal of the word line when the hole is formed.

In accordance with the second aspect of the present invention, the underlay insulative film formed on the lower surface of the etching stopper film may alleviates stresses applied to the semiconductor substrate when the etching stopper film is etched.

In accordance with the third aspect of the present invention, the removal of the part of the underlay insulative film which is located in the hole by the etching allows the sidewall insulative film to be formed extending from the top of the side surface of the hole in which the underlay insulative film is removed to the semiconductor substrate.

The fourth aspect of the present invention may prevent wiring errors and wiring resistance errors of the bit line when the hole is formed.

In accordance with the fifth aspect of the present invention, the contact hole may be formed in the dynamic RAM semiconductor device having the structure of two or more interconnect levels, and the transistor characteristics may be prevented from deteriorating due to the removal of the word line when the hole is formed.

In accordance with the sixth aspect of the present invention, the contact hole may be formed in the fabrication of the semiconductor device having the structure of two or more interconnect levels, and transistor characteristics may be prevented from deteriorating due to removal of the word line when the hole is formed.

In accordance with the seventh aspect of the present invention, the contact hole may be formed in the semiconductor device having the structure of two or more interconnect levels, and the removal of the word line is effectively prevented when the hole is formed.

The eighth aspect of the present invention may effectively remove the word line and form the hole in a self-aligned manner.

In accordance with the ninth aspect of the present invention, the stresses applied to the semiconductor substrate may be alleviated when the etching stopper film is etched.

In accordance with the tenth aspect of the present invention, the sidewall insulative film may be formed extending from the top of the side surface of the hole in which the underlay insulative film is removed to the semiconductor substrate.

It is therefore a primary object of the present invention to provide a semiconductor device having an at least two-level interconnection structure including word lines (gate electrodes) under bit lines, as well as a one-level interconnection structure, which enables the production of contact holes without the removal of the word lines, and a method of fabricating the same.

It is another object of the present invention to provide a semiconductor device which prevents disconnection and wiring resistance errors of bit lines if misalignment exists during the production of a mask, and a method of fabricating the same.

These and other objects, features, aspects and advantages of the present invention will become more apparent from the following detailed description of the present invention when taken in conjunction with the accompanying drawings.

DESCRIPTION OF THE PREFERRED EMBODIMENTS (Premise of the Invention)

Prior to the description of preferred embodiments of the present invention, the technique disclosed in Japanese Patent Application Laid-Open No. 5-75060 simply applied to a semiconductor device having a two-level interconnection structure will be described hereinafter.

Figure 1:
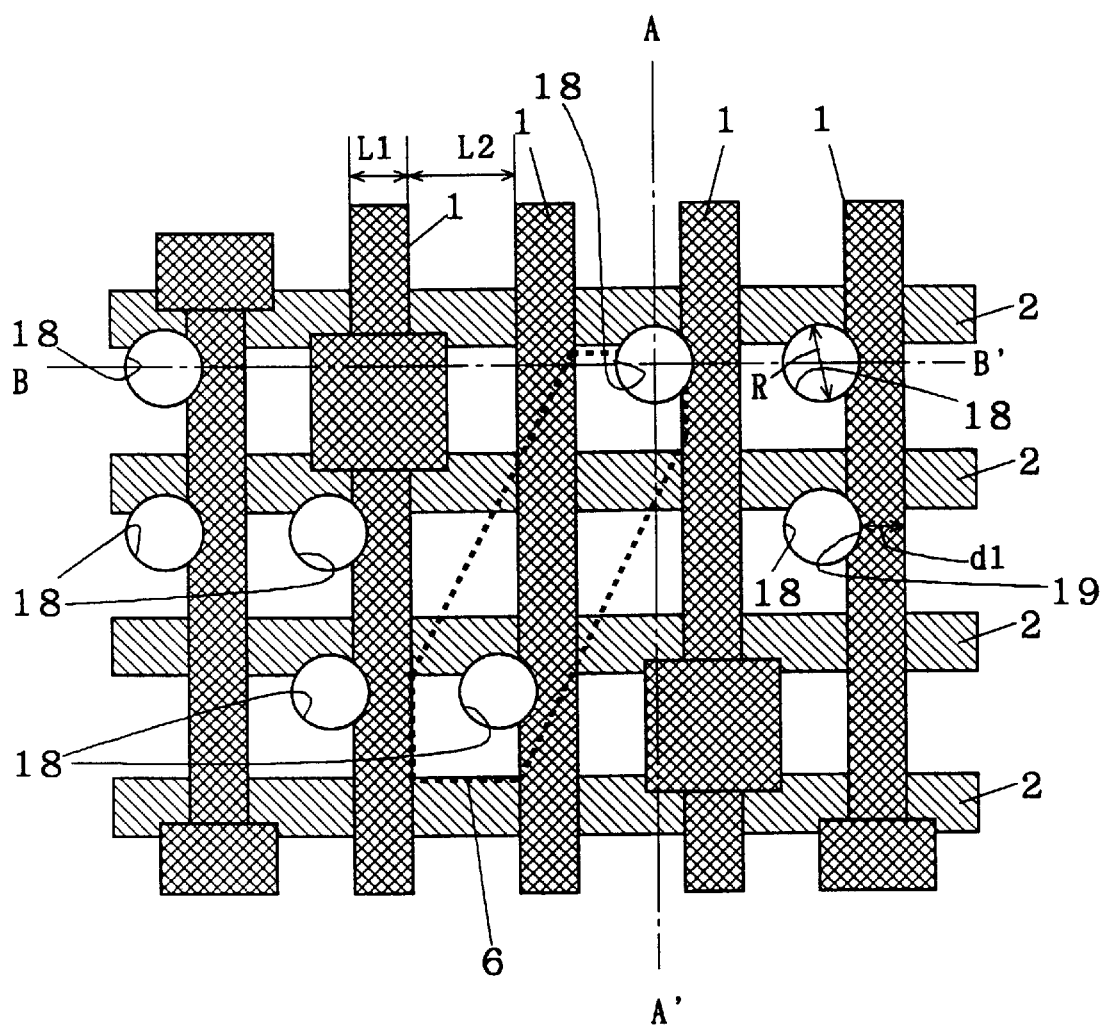
FIG. 1 is a plan view of a semiconductor device in a mask production stage according to the premise of the present invention.
Figure 2:
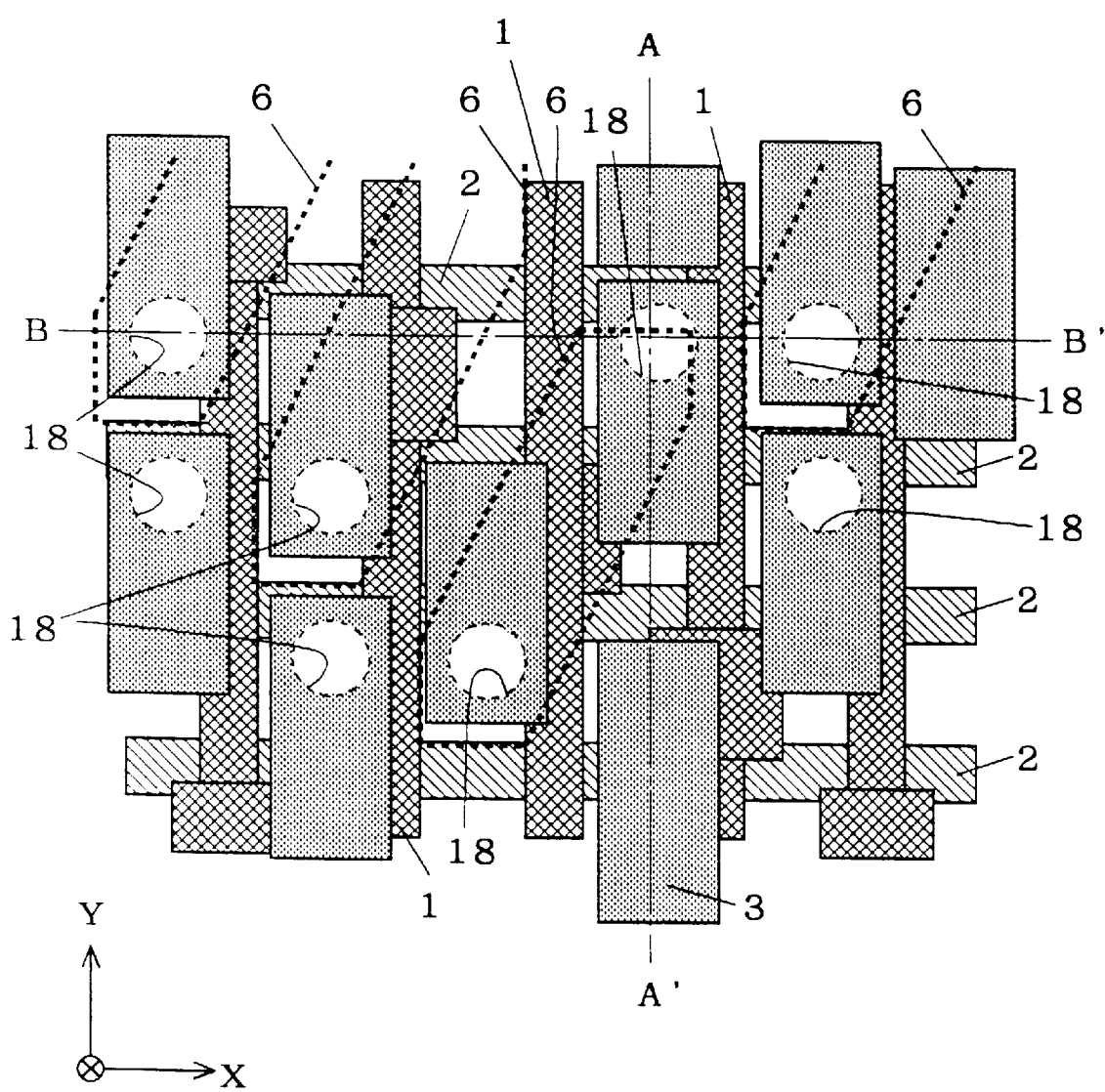
FIG. 2 is a plan view of the semiconductor device in a capacitor production stage according to the premise of the present invention.

FIG. 1 is a plan view of a semiconductor device in a mask production stage when a misalignment of contact holes exists according to the premise of the present invention. FIG. 2 is a plan view of the semiconductor device in a capacitor production stage when a misalignment of contact holes exists according to the premise of the present invention. FIGS. 3 through 18 are cross-sectional views illustrating respective steps of the fabrication of the semiconductor device according to the premise of the present invention.

The fabrication method disclosed in Japanese Patent Application Laid-Open No. 5-75060 is applied to a dynamic RAM semiconductor device having the two-level interconnection structure including bit lines 1 and word lines 2. It is assumed that a misalignment exists, the diameter of a contact hole is not enlarged, and a line is not thinned.

In the mask production stage, as depicted in FIG. 1, the plurality of bit lines 1 (of a width L1) and the plurality of word lines 2 are arranged to intersect at right angles. The bit lines 1 are spaced a distance L2 from each other. Contact holes 18 (of a diameter R) are shifted upwardly and rightwardly from the normal position thereof, thereby creating parts 19 of the bit lines 1 which are of a reduced width (d1).

Referring to FIG. 2, neither the bit lines 1 nor the word lines 2 appear in the contact holes 18. This indicates that parts of the bit lines 1 and word lines 2 which are located within the contact holes are removed in the capacitor production stage, as will be described later.

The respective steps of the fabrication of the semiconductor device having the two-level interconnection structure are described below with reference to FIGS. 3 through 18. Pairs of cross sections taken along the line A–A' and the line B–B' of FIGS. 1 and 2 are illustrated in FIGS. 3 through 18.

Figure 3:
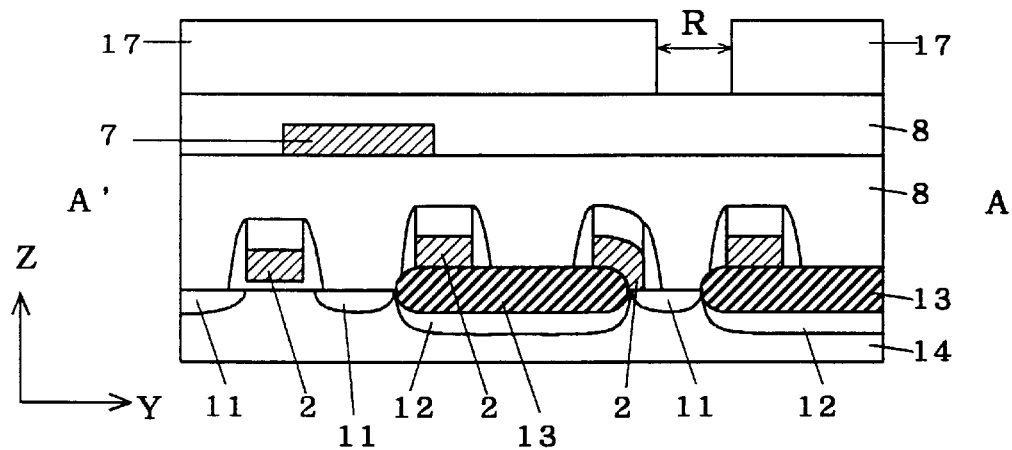
FIGS. 3 through 18 are cross-sectional views illustrating respective steps of the fabrication of the semiconductor device according to the premise of the present invention.
Figure 4:
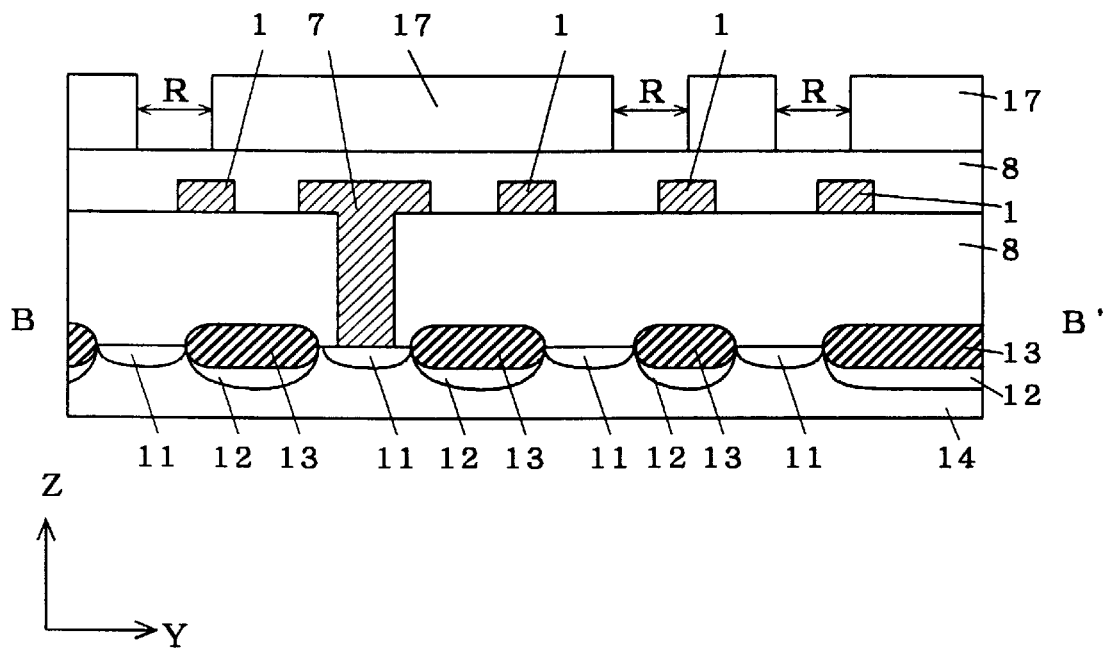

Referring to FIGS. 3 and 4, a photoresist 17 having an opening of a diameter R and serving as a mask for patterning of storage nodes 3 by photolithography is formed over memory cells including the bit lines 1 and the word lines 2 formed in an interlayer insulative film ($SiO_2$) 8.

Figure 5:
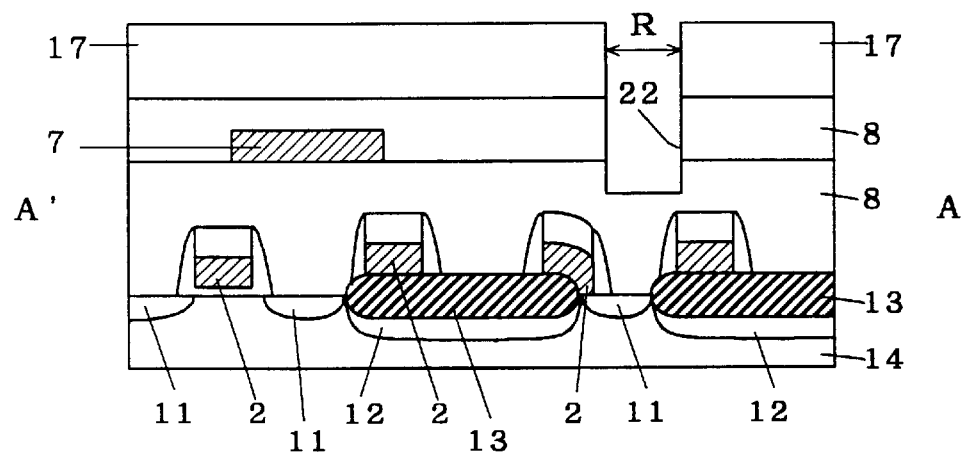
Figure 6:
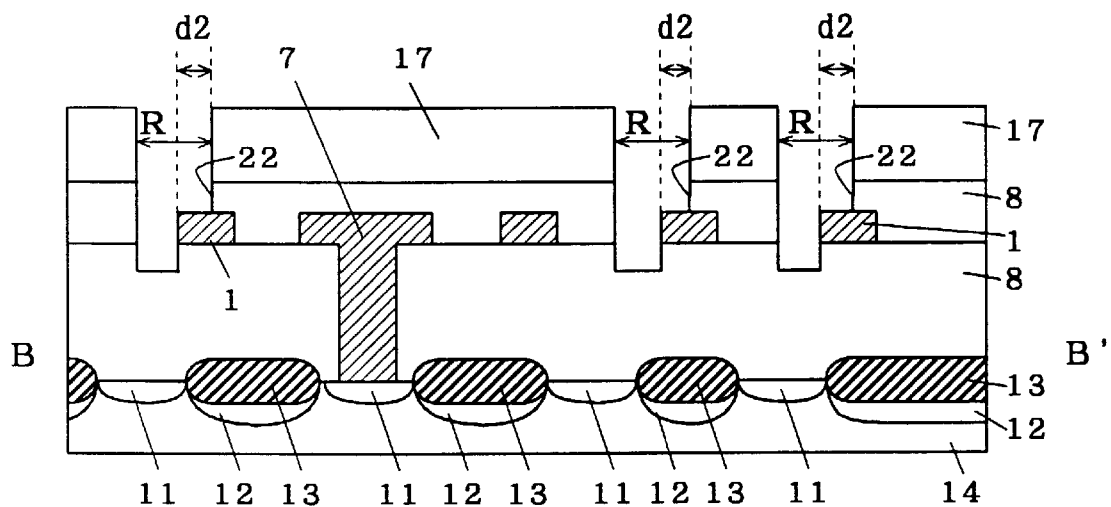

After the fabrication step shown in FIGS. 3 and 4, the interlayer insulative film 8 is subjected to RIE anisotropic etching as illustrated in FIGS. 5 and 6. Holes 22 are formed so that the bit lines 1 exposed to this etching are not etched away since this etching is $SiO_2$ etching having a high selection ratio (about 10 or greater) for the bit lines 1. This etching exposes a length d2 of the bit lines 1 in the holes 22.

Figure 7:
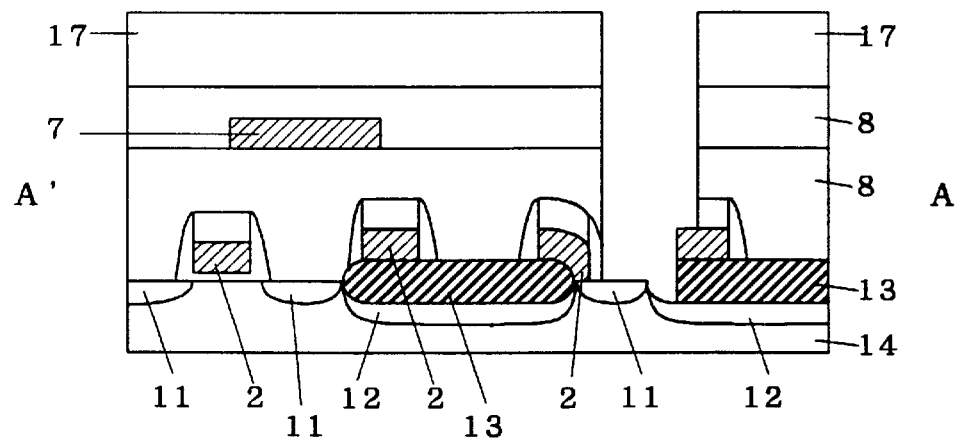
Figure 8:
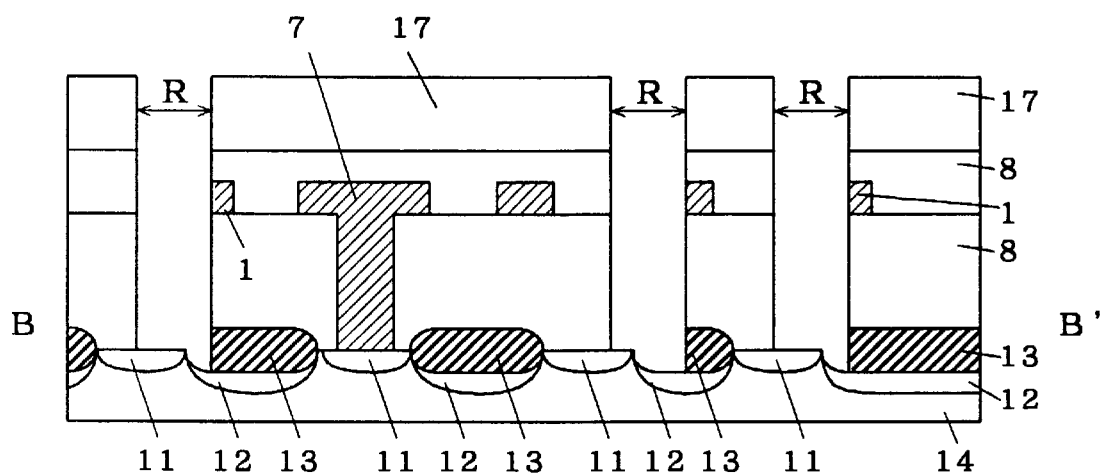

After the fabrication step shown in FIGS. 5 and 6, the exposed parts (d2) of the bit lines 1 are anisotropically etched as illustrated in FIGS. 7 and 8. The word line 2 is exposed. Subsequently continued etching causes an isolation insulative film 13 to be etched off to expose a p-type impurity diffusion layer 12 serving as a channel stopper.

Figure 9:
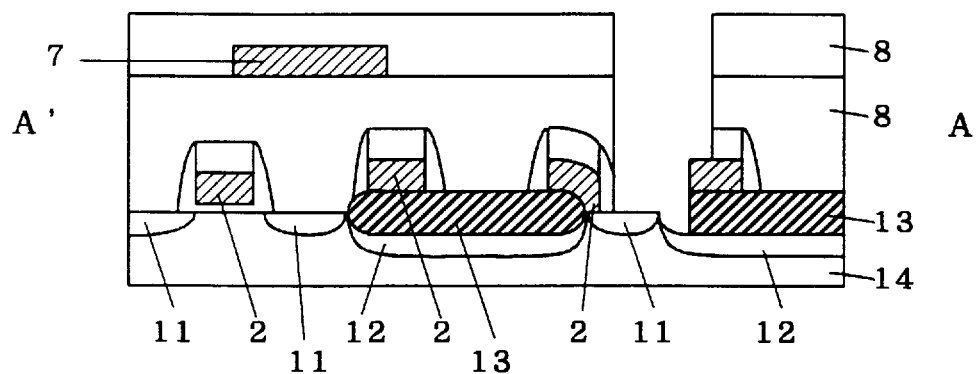
Figure 10:
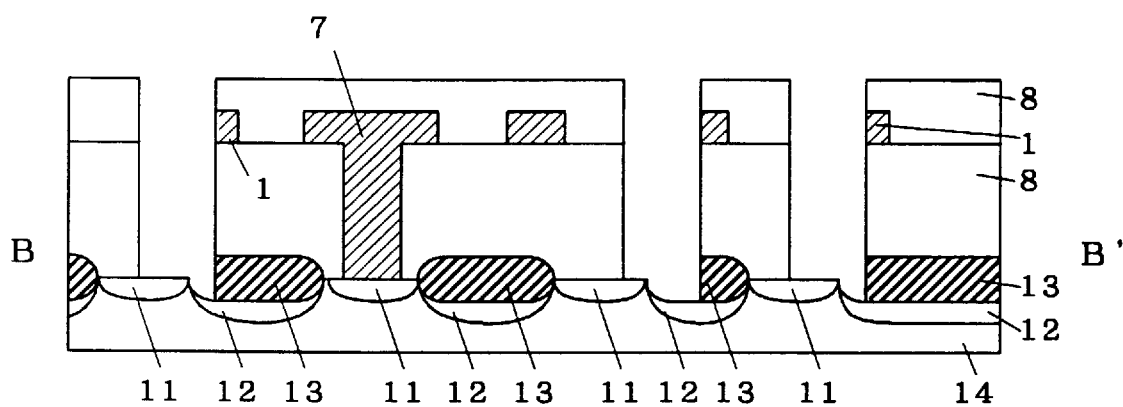

After the fabrication step shown in FIGS. 7 and 8, the photoresist 17 is removed by the $O_2$ plasma ashing process as illustrated in FIGS. 9 and 10.

Figure 11:
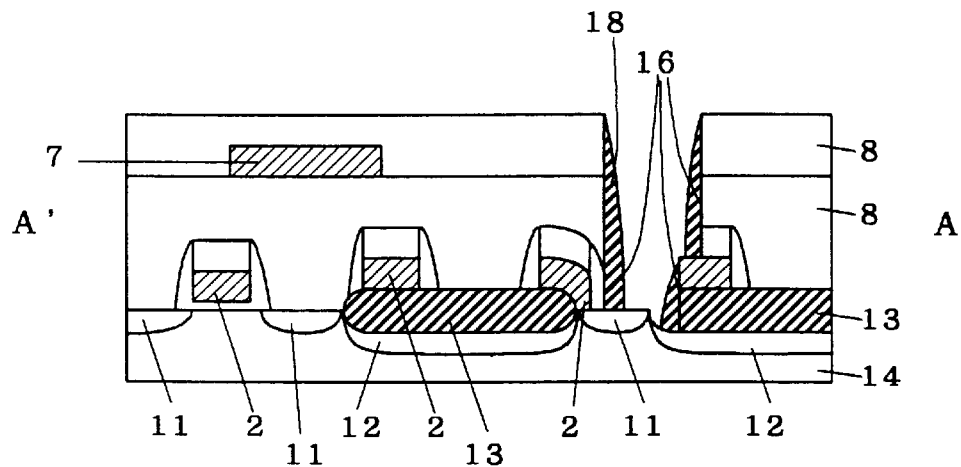
Figure 12:
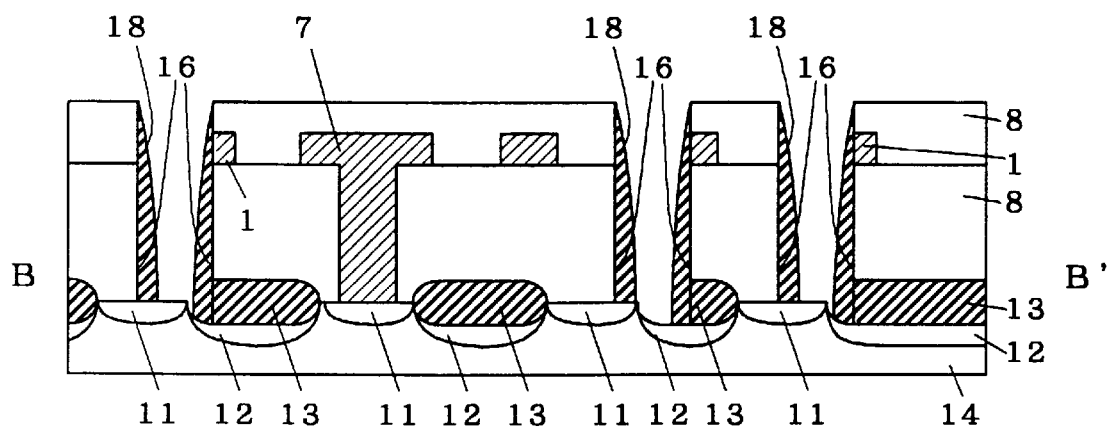

After the fabrication step shown in FIGS. 9 and 10, it is assumed that an insulative film ($SiO_2$) is deposited by the CVD process and the RIE anisotropic etching is performed on the entire surface to form sidewall insulative films 16, as illustrated in FIGS. 11 and 12. The sidewall insulative films 16 are not deposited on a part (shoulder part) of the word line 2 exposed by the etching, and the word line 2 remains exposed in the contact hole 18.

Figure 13:
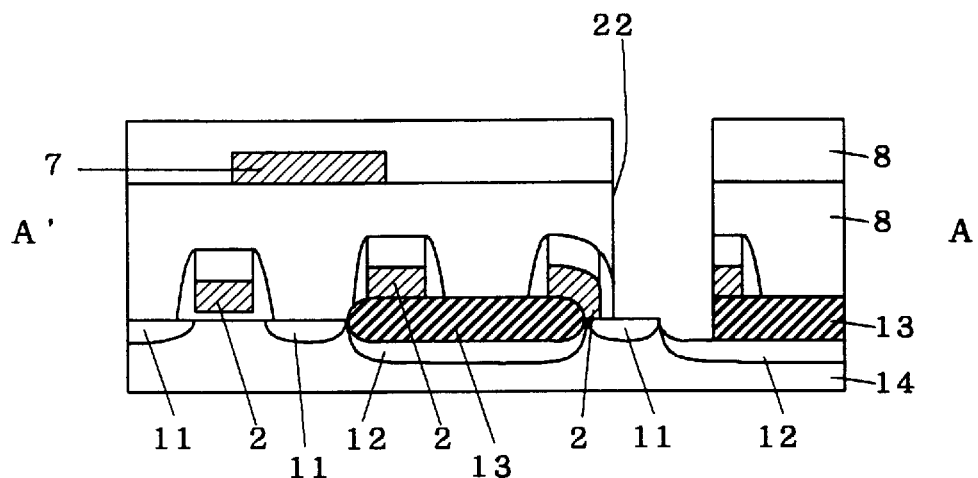
Figure 14:
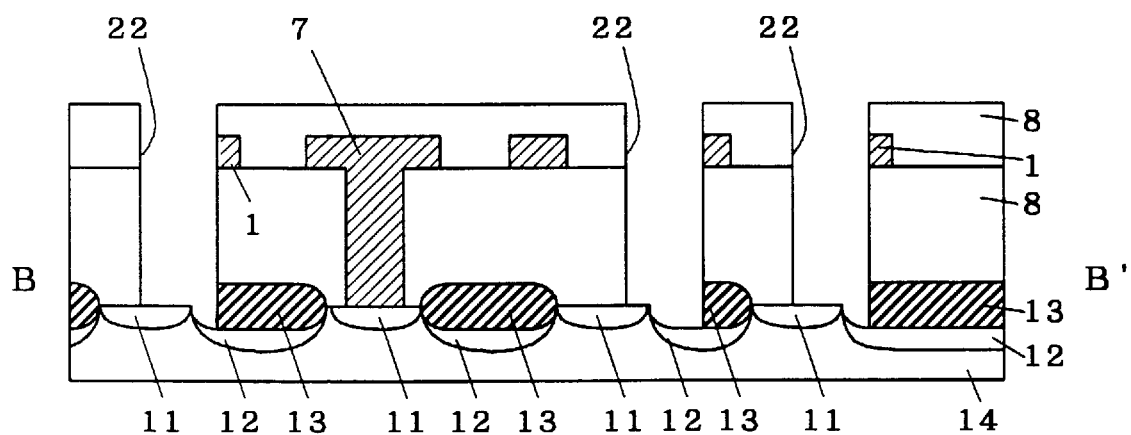
Figure 15:
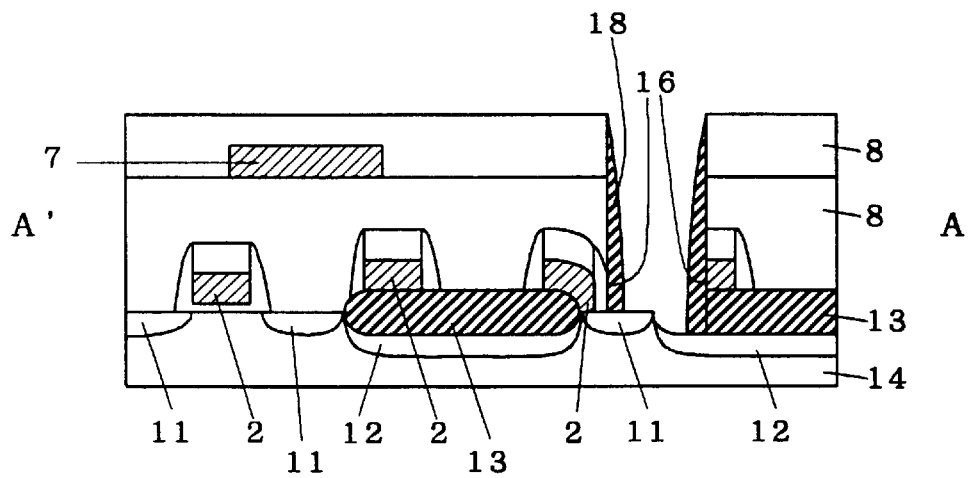
Figure 16:
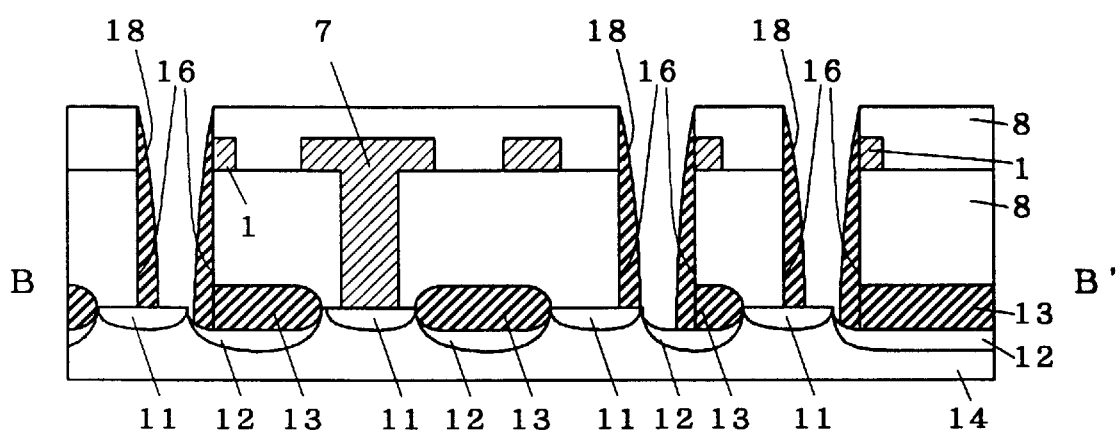

To solve this problem, the RIE anisotropic etching should be performed on the word line 2 along the sidewalls of the hole 22 as illustrated in FIGS. 13 and 14 after the fabrication step shown in FIGS. 11 and 12 before the sidewall insulative films 16 are formed, thereby forming the etched word line 2. This allows the sidewall insulative films 16 to be formed without partially exposing the etched word line 2 as illustrated in FIGS. 15 and 16. Then, the contact holes 18 for the storage nodes 3 may be formed.

Figure 17:
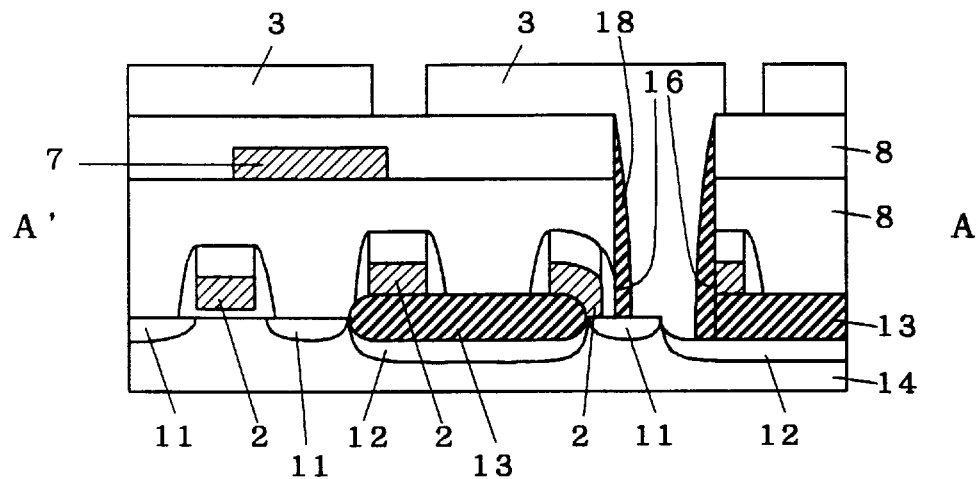
Figure 18:
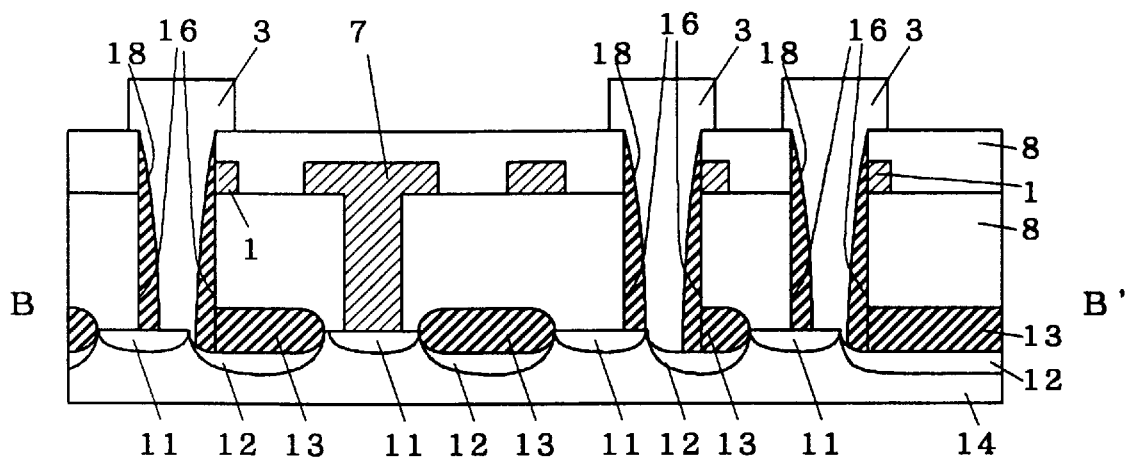

After the fabrication step shown in FIGS. 15 and 16, the storage nodes 3 are buried in the contact holes 18 as illustrated in FIGS. 17 and 18. Thereafter, a dielectric film and a cell plate both not shown are stacked to form capacitors.

In the application of the fabrication method disclosed in Japanese Patent Application Laid-Open No. 5-75060 to the semiconductor device having the two-level interconnection structure, the word line 2 must be partially removed as shown in FIG. 13 to prevent a short-circuit between the part of the word line 2 exposed by the etching shown in FIGS. 11 and 12 and the storage node 3. The dimension of the gate electrode (word line 2) significantly influences the electrical characteristics of the MOS transistor. By partially removing the word line 2, the source-drain current (in an n-type impurity diffusion layer 11) fails to be cut off when the gate is off, and electric charges are not accumulated in the storage node 3 of FIG. 17. Then, the semiconductor device fails to function as a dynamic RAM device.

Further, the word lines 2 are generally formed on the isolation insulative film 13. An end portion of the isolation insulative film 13 is also removed after the word line 2 is partially removed. Since the p-type impurity diffusion layer 12 which is of a conductivity type opposite to that of the source/drain (n-type impurity diffusion layer 11) connected to the storage node 3 is formed under the isolation insulative film 13, the electric charges in the storage node 3 flow away into a p-type Si substrate 14 and are not accumulated in the storage node 3. Then, the semiconductor device fails to function as the dynamic RAM device.

As mentioned above, the prior art method (disclosed in Japanese Patent Application Laid-Open No. 5-75060) applied to the semiconductor device having the two-level interconnection structure is disadvantageous in that the word line 2 is partially removed to form the hole 22. On the other hand, it is difficult to form the hole 22 in the interconnect layers including the bit lines 1 and the word lines 2 (particularly the gate electrodes) except where the word lines 2 are formed.

The present invention provides a method of forming contact holes without removing the word lines 2 in a semiconductor device having at least two interconnect levels.

(First Preferred Embodiment)

A semiconductor device according to a first preferred embodiment of the present invention will now be described with reference to the drawings.

Figure 19:
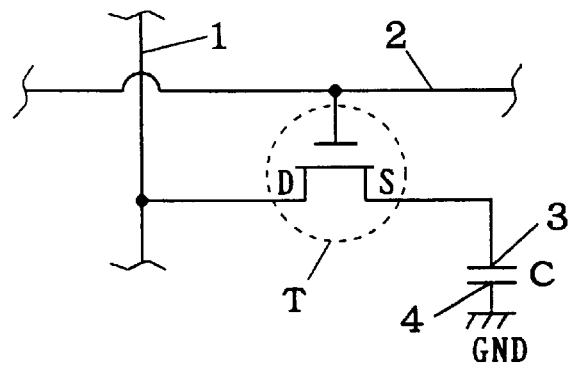
FIG. 19 is an equivalent circuit diagram of the semiconductor device according to the present invention.
Figure 20:
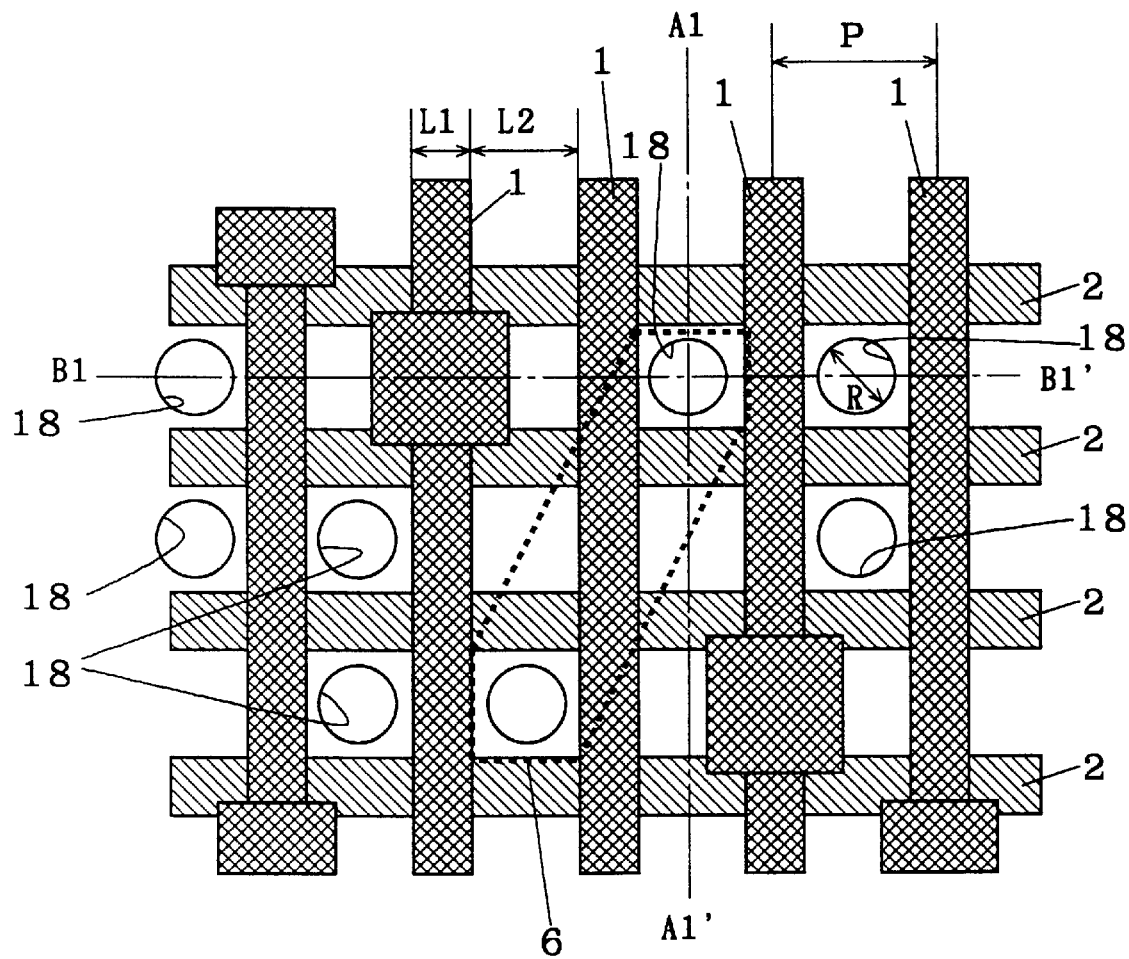
FIG. 20 is a view of the semiconductor device in the mask production stage according to the present invention.
Figure 21:
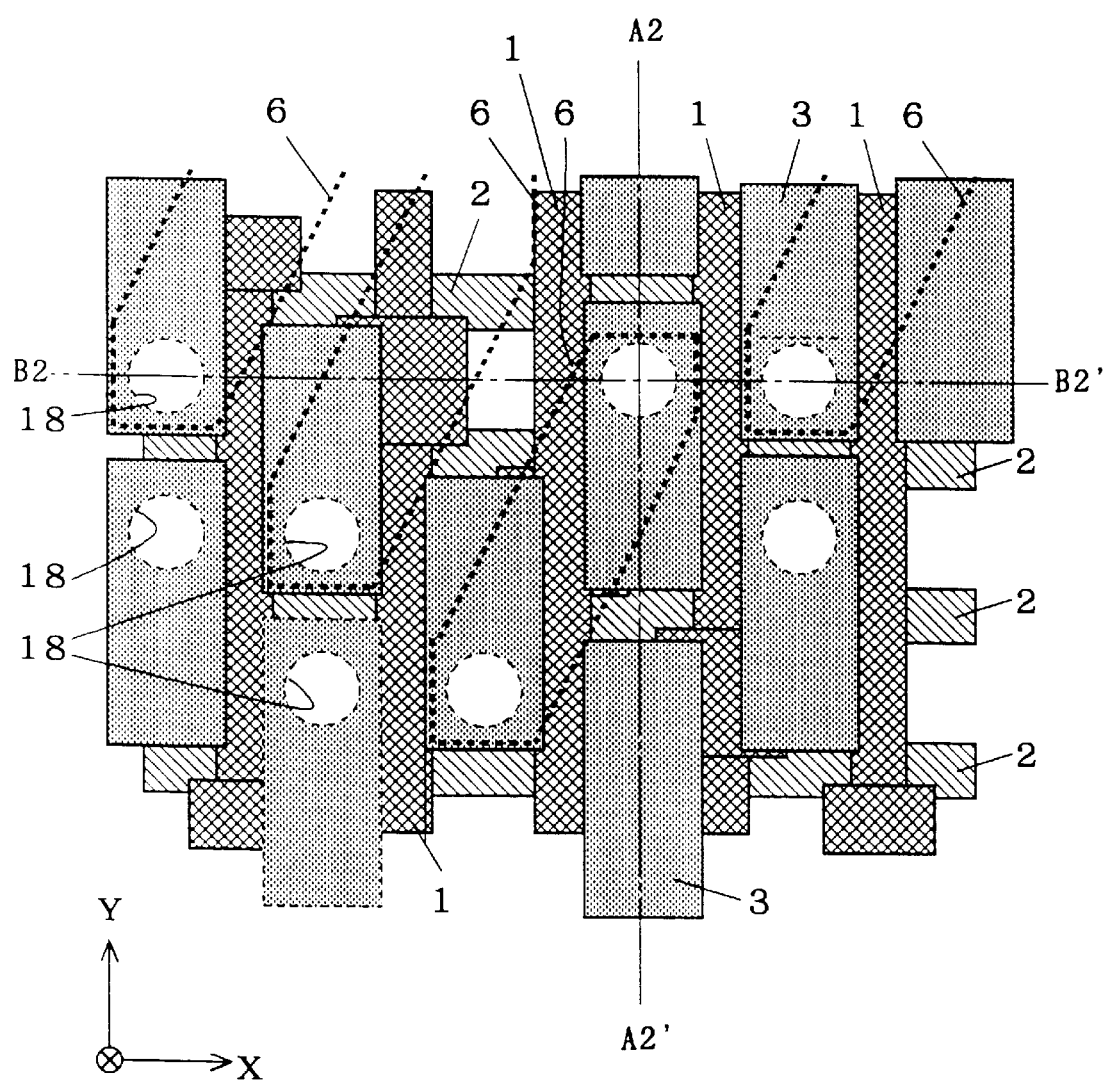
FIG. 21 is a plan view of the semiconductor device in the capacitor production stage of according to the present invention.
Figure 22:
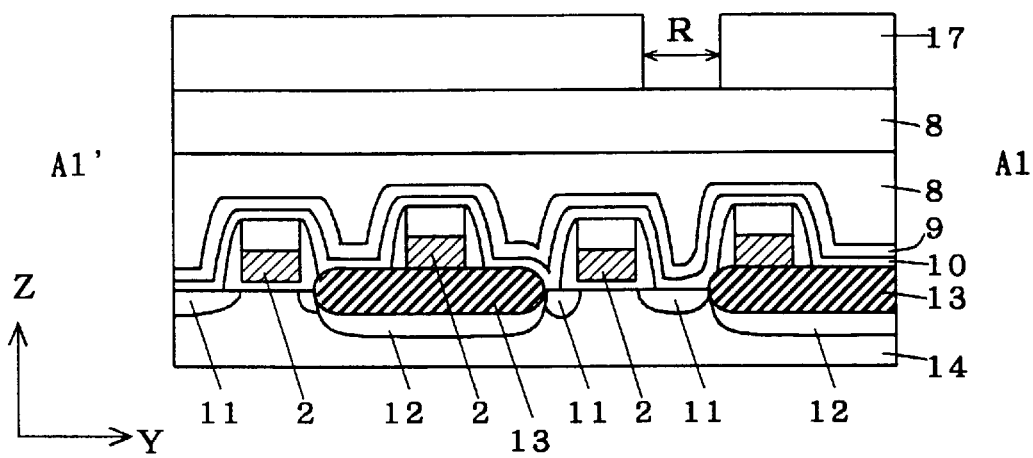
FIG. 22 is a cross-sectional view of the semiconductor device in the mask production stage taken along the line A1'–A1 of FIG. 20 according to the present invention.
Figure 23:
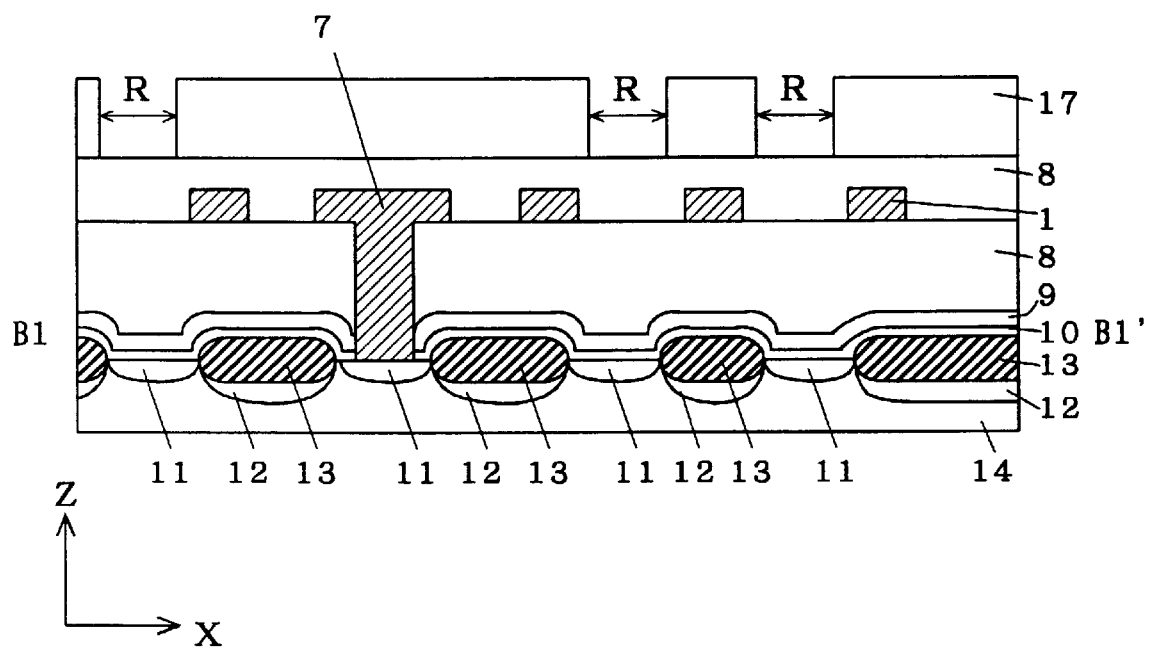
FIG. 23 is a cross-sectional view of the semiconductor device in the mask production stage taken along the line B1–B1' of FIG. 20 according to the present invention.
Figure 24:
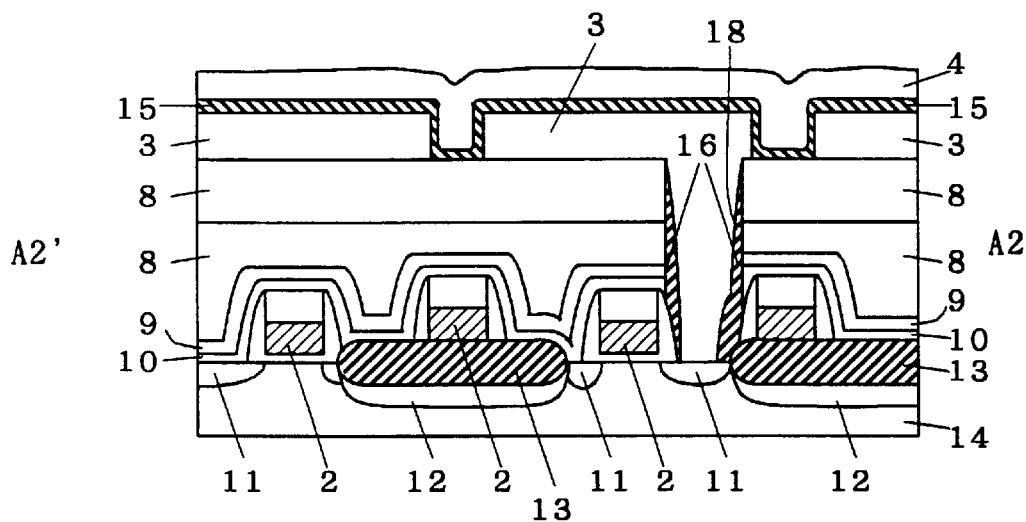
FIG. 24 is a cross-sectional view of the semiconductor device in the capacitor production stage taken along the line A2'–A2 of FIG. 21 according to the present invention.
Figure 25:
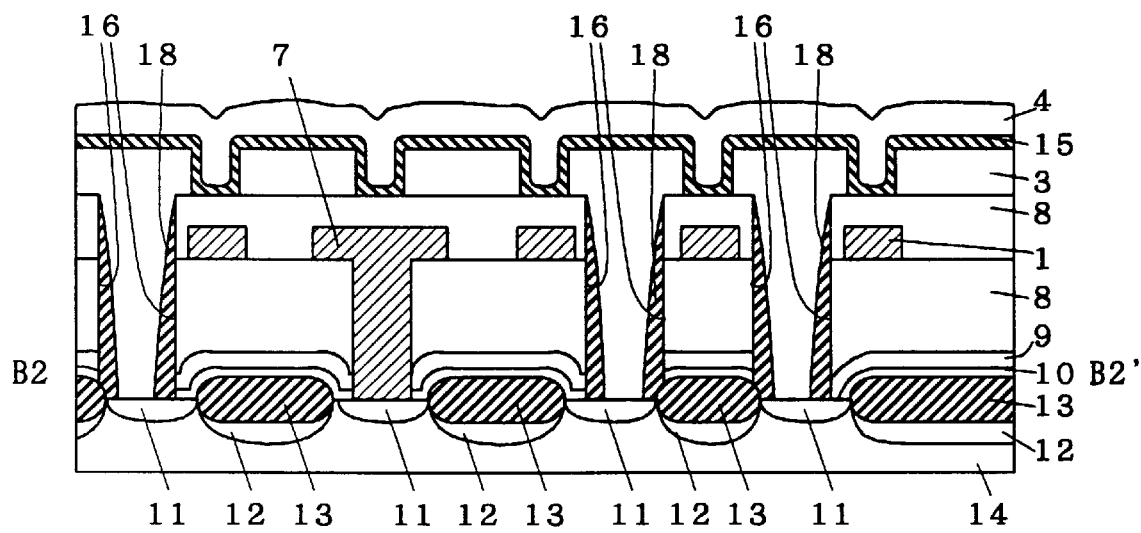
FIG. 25 is a cross-sectional view of the semiconductor device in the capacitor production stage taken along the line B2–B2' of FIG. 21 according to the present invention.

FIG. 19 is an equivalent circuit diagram of a dynamic RAM semiconductor device. FIG. 20 is a plan view of the dynamic RAM semiconductor device in the masking stage. FIG. 21 is a plan view of the dynamic RAM semiconductor device after the production of capacitors. FIG. 22 is a cross-sectional view of the semiconductor device in the masking stage taken along the line A1'–A1 of FIG. 20. FIG. 23 is a cross-sectional view of the semiconductor device in the masking stage taken along the line B1–B1' of FIG. 20. FIG. 24 is a cross-sectional view of the semiconductor device in the capacitor production stage taken along the line A2'–A2 of FIG. 21. FIG. 25 is a cross-sectional view of the semiconductor device in the capacitor production stage taken along the line B2–B2' of FIG. 21.

Referring to FIG. 19, the bit line 1 of the dynamic RAM is connected to the drain of a transistor T, and the word line 2 is connected to the gate electrode of the transistor T. The source of the transistor T is grounded through a capacitor C. The capacitor C has a first terminal connected to the source of the transistor T and serving as the storage node 3, and a second terminal connected to the ground GND and serving as a cell plate 4.

As illustrated in FIGS. 24 and 25, the cell plate 4 is connected to the ground GND not shown. The cell plate 4, the storage node 3, and a dielectric film 15 form the capacitor C. The storage node 3 is connected to the n-type impurity diffusion layer 11. When voltage is applied to the word line 2 functioning as the gate electrode to form a channel in the capacitor C, electrical continuity is provided between the capacitor C and the bit line 1.

FIG. 20 illustrates, in plan view, the dynamic RAM semiconductor device in the masking stage (although the photoresist 17 is not shown) during the fabrication step of the contact holes 18 in normal conditions wherein no misalignment exists, the diameter of the contact holes 18 is not enlarged, and the bit lines 1 are not thinned. As illustrated in FIG. 20, the plurality of word lines 2 are arranged in parallel, and the plurality of bit lines 1 (width L1) are arranged on the upper surface of the word lines 2 at a pitch P in evenly spaced relation (spacing L2) so as to intersect the word lines 2 at right angles. The plurality of contact holes 18 (diameter R) are formed between the bit lines 1 and the word lines 2 but do not overlap the bit lines 1 and the word lines 2. The reference numeral 6 designates a device region for storing 2-bit data of the dynamic RAM. Me word lines 2 (transfer gates), the bit lines 1, and the contact holes 18 for the storage nodes 3 form the dynamic RAM.

In FIG. 21 is shown the semiconductor device of FIG. 20 with the storage nodes 3 in the capacitor production stage. Like reference numerals are used in FIG. 21 to designate elements identical with those of FIG. 20. The contact holes 18 are actually positioned under the storage nodes 3 and are indicated by the blank circles of FIG. 21 for ease of understanding of the positions thereof.

Referring to FIGS. 22 and 23, the n-type impurity diffusion layer 11 serving as the source/drain, the p-type impurity diffusion layer 12 serving as the channel stopper, and the isolation insulative film 13 are formed on the p-type Si substrate 14. The word lines 2 functioning as the gate electrodes are formed on the surfaces of the p-type Si substrate 14 and isolation insulative film 13. If an etching stopper film 9 to be described later is directly placed on the p-type Si substrate 14, the p-type Si substrate 14 is subjected to stresses which might induce crystal defects. To alleviate the stresses, an etching stopper underlay insulative film 10 ($SiO_2$) serving as a buffer layer is formed over the word lines 2 by the CVD process. The etching stopper film 9 ($Si_3N_4$) serving as a sacrificial film for stopping plasma etching to be described later is formed to cover the etching stopper underlay insulative film 10. The interlayer insulative film 8 and the bit lines 1 are stacked on the etching stopper film 9. The reference numeral 7 designates a region for connection between the bit lines 1 and the drain (n-type impurity diffusion layer 11). The photoresist 17 having an opening of the diameter R and serving as an etch mask is formed on the interlayer insulative film 8. Since the bit lines 1 are generally etched under conditions of no selectivity for the p-type Si substrate 14, the surface of the p-type Si substrate 14 is etched or roughed, which might increase the contact resistance and induce the crystal defects. The etching stopper film 9 functions as a sacrificial film or a buffer layer so that subsequent etching of the bit lines 1 does not cause the p-type Si substrate 14 to be etched.

Referring to FIGS. 24 and 25, using the photoresist 17 of FIGS. 22 and 23 as a mask, the contact holes 18 are formed to provide the capacitor including the storage node 3, the dielectric film 15, and the cell plate 4. In the arrangement of FIGS. 22 and 23, holes are formed, and the interlayer insulative films 16 are formed on the side surfaces of the holes, whereby the contact holes 18 are formed. The contact holes 18 are filled with the storage nodes 3, and the dielectric film 15 is brought into intimate contact with the surface of the storage nodes 3. The cell plate 4 is formed on the dielectric film 15, thereby forming the capacitor C (FIG. 19). The above described process produces the semiconductor device according to the present invention wherein no misalignment of the contact holes exists.

Figure 26:
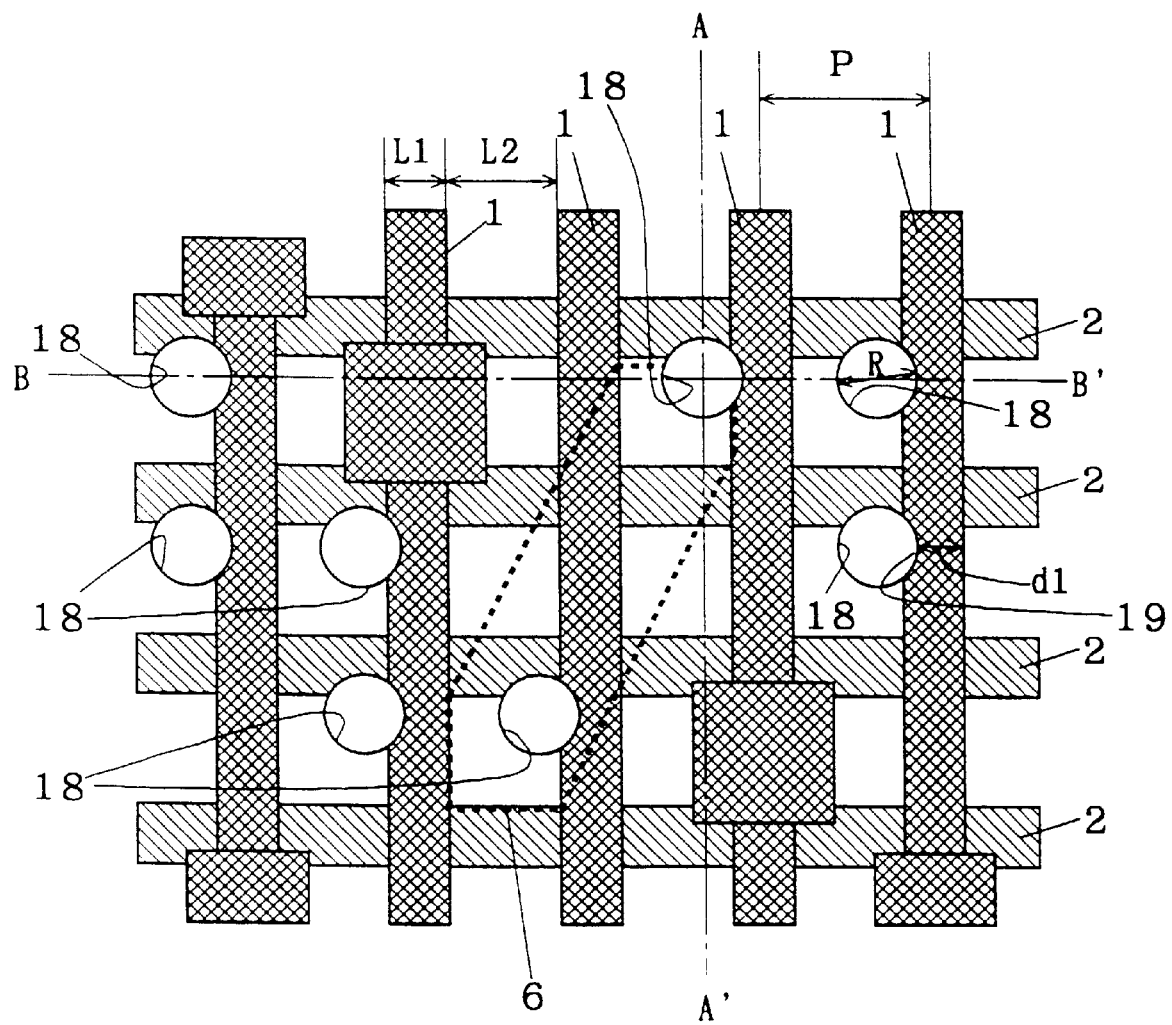
FIG. 26 is a plan view of the semiconductor device in the mask production stage according to the present invention.
Figure 27:
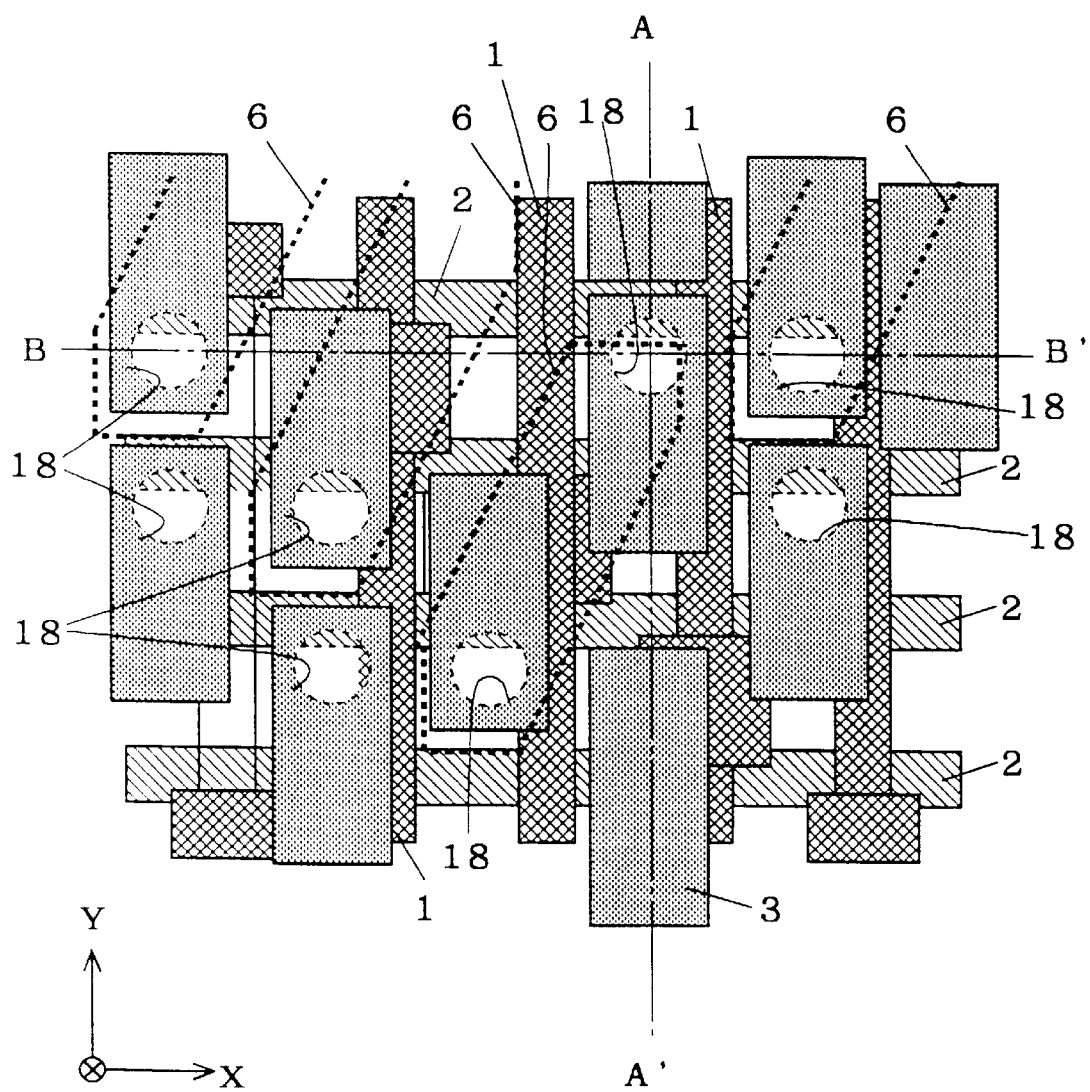
FIG. 27 is a plan view of the semiconductor device in the capacitor production stage according to the present invention.

The semiconductor device wherein the misalignment of the contact holes exists is discussed below. FIG. 26 is a plan view of the semiconductor device in the mask production stage according to the first preferred embodiment of the present invention when the misalignment of the contact holes exists. FIG. 27 is a plan view of the semiconductor device in the capacitor production stage according to the first preferred embodiment of the present invention when the misalignment of the contact holes exists. FIGS. 28 through 41 are cross-sectional views illustrating respective steps of the fabrication of the semiconductor device according to the first preferred embodiment of the present invention.

FIG. 26 is a view for illustrating a mask misalignment. In this stage, the contact holes 18 have not yet been actually formed. Then, FIG. 26 is basically similar to FIG. 1 showing the premise of the present invention. Referring to FIG. 27, the contact holes 18 have already been actually formed using the technique of the present invention, and FIG. 27 differs from FIG. 2 showing the premise of the present invention because of the use of the technique of the present invention. Specifically, the word lines 2 underlying the contact holes 18 appear unremoved in the contact holes 18 formed by the technique of the present invention.

The method of fabricating the semiconductor device according to the first preferred embodiment is described hereinafter with reference to FIGS. 28 through 41. Pairs of cross sections taken along the line A–A' and the lines B–B' of FIGS. 26 and 27 are illustrated in FIGS. 28 through 41.

Figure 28:
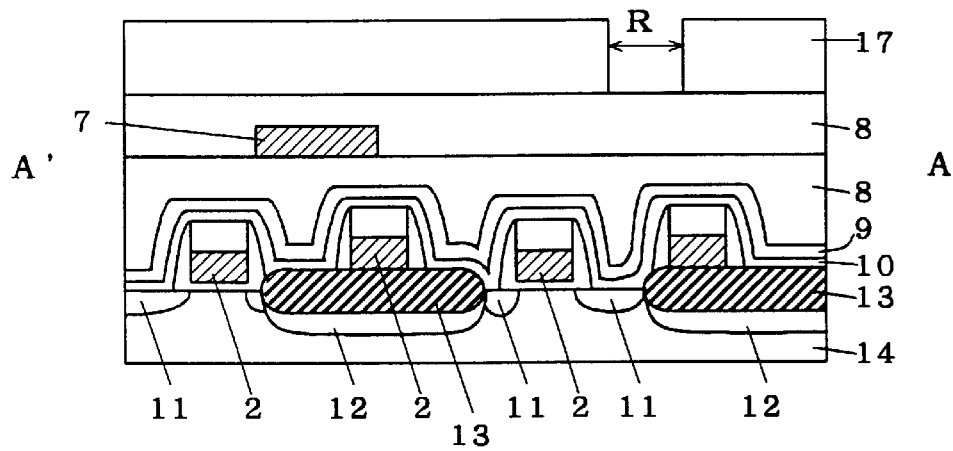
FIGS. 28 through 41 are cross-sectional views illustrating respective steps of the fabrication of the semiconductor device according to a first preferred embodiment of the present invention.
Figure 29:
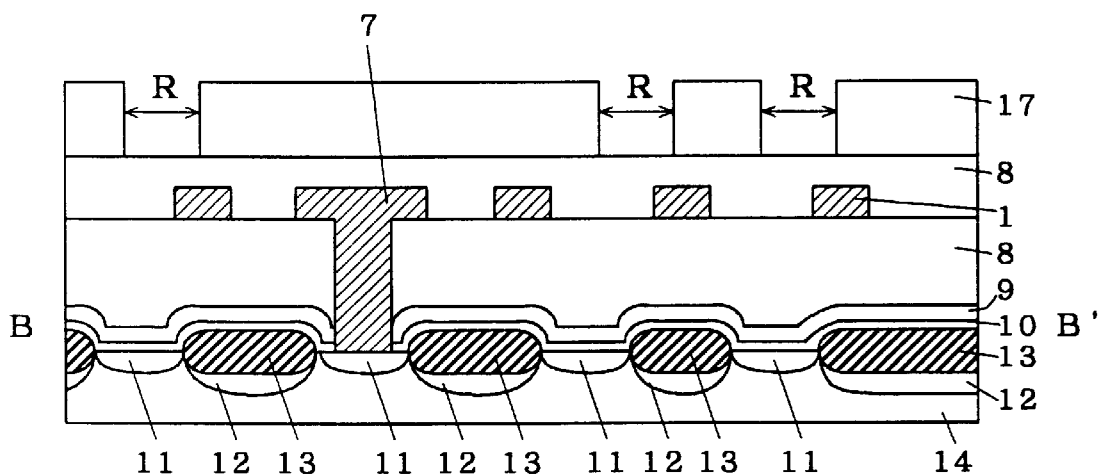

FIGS. 28 and 29 are cross-sectional views of the semiconductor device in the masking stage taken along the lines A'–A and B–B' of FIG. 26, respectively. The photoresist 17 has openings of the diameter R which is equal to the diameter of the contact holes. In this fabrication step, the patterning of the photoresist 17 is completed.

Figure 30:
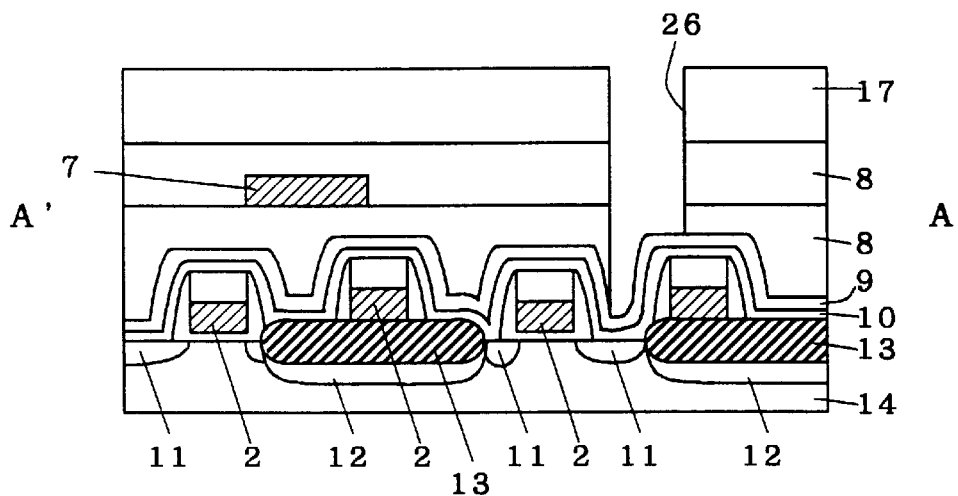
Figure 31:
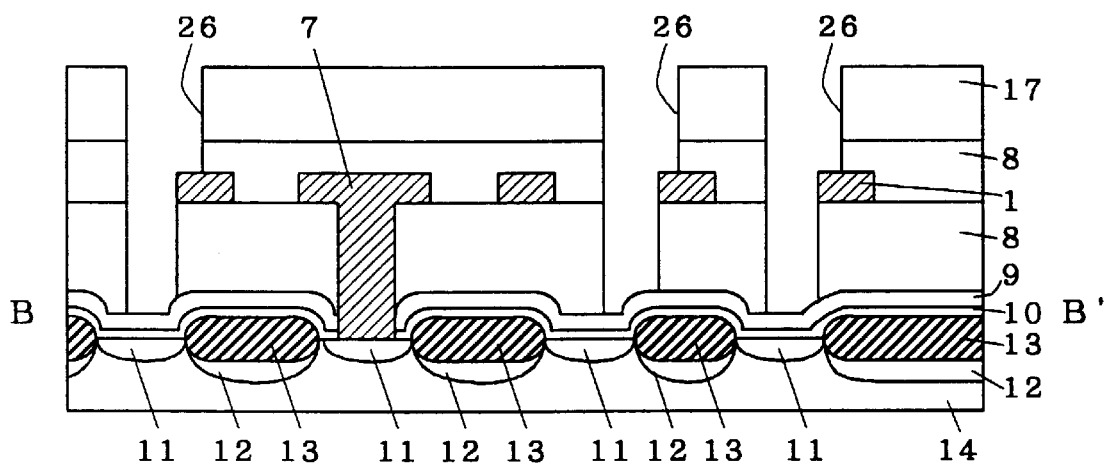

After the fabrication step shown in FIGS. 28 and 29, RIE anisotropic etching is performed on the interlayer insulative film (SiO$_2$) 8 to form holes 26, as shown in FIGS. 30 and 31. The bit lines 1 are not removed by this etching which has a higher selection ratio (about 10 or greater) for the bit lines 1 than for the interlayer insulative film 8. Additionally, this anisotropic etching is performed under conditions of a high selection ratio (about 10 or greater) for the Si$_3$N$_4$ film, and is thus stopped at the etching stopper film 9 (Si$_3$N$_4$ film). The anisotropic etching may employ the etching described in, for example, "Semiconductor World 1993. 10, pp. 68–75" and "Extended Abstracts (The 41st Spring Meeting, 1994), The Japan Society of Applied Physics and Related Societies, 29p-ZF-1".

Figure 32:
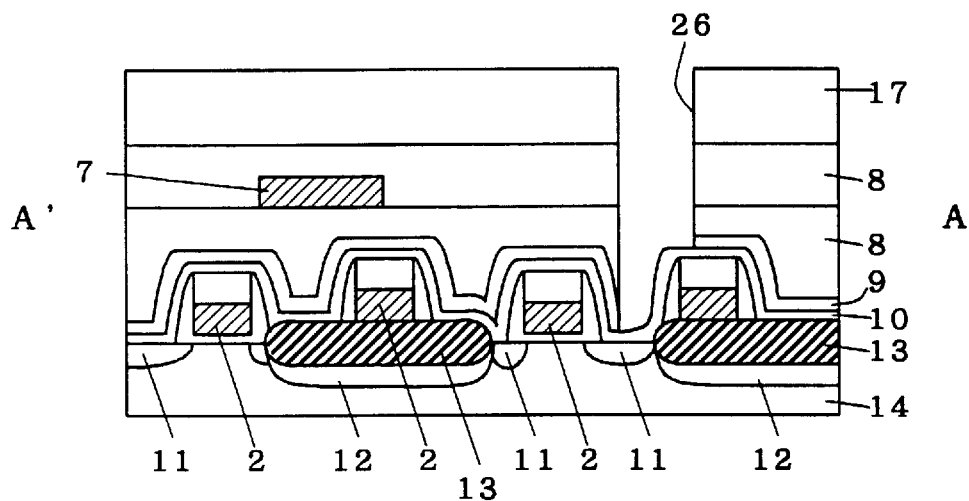
Figure 33:
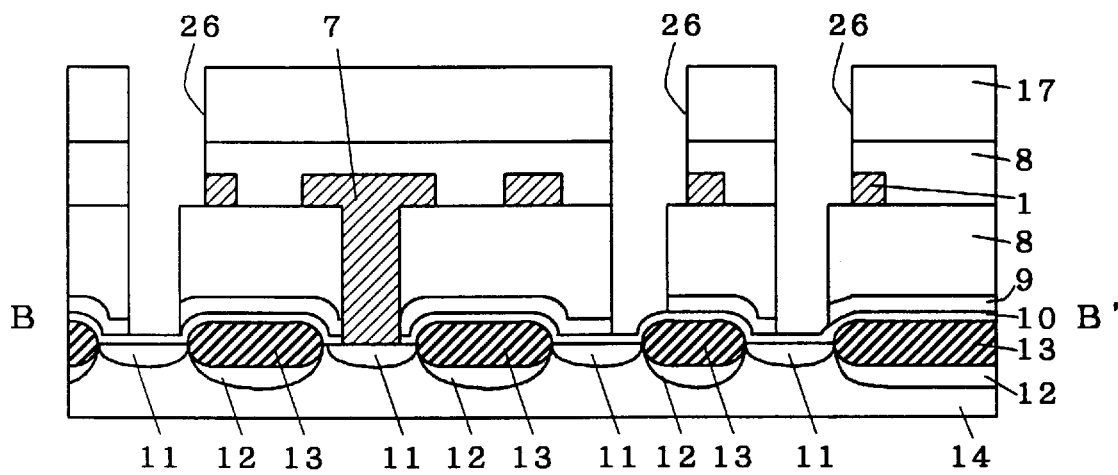

After the fabrication step shown in FIGS. 30 and 31, plasma etching having a high selectivity for the etching stopper underlay insulative film (SiO$_2$) 10 (having a low selectivity for the bit lines 1 and the etching stopper film 9) is performed on the parts of the bit lines 1 and etching stopper film 9 which are exposed in the holes 26 to simultaneously remove the exposed parts of the etching stopper film 9 and bit lines 1 as illustrated in FIGS. 32 and 33. This etching process may be such that RIE anisotropic etching having a high selectivity for the etching stopper film 9 is performed on the bit lines 1. More specifically, after the exposed part of the bit line 1 is removed, the etching stopper underlay insulative film 10 is etched at the same time that the exposed part of the etching stopper film 9 is removed by etching having a low selectivity for the etching stopper underlay insulative film 10 and having a high selectivity for the p-type Si substrate 14.

Figure 34:
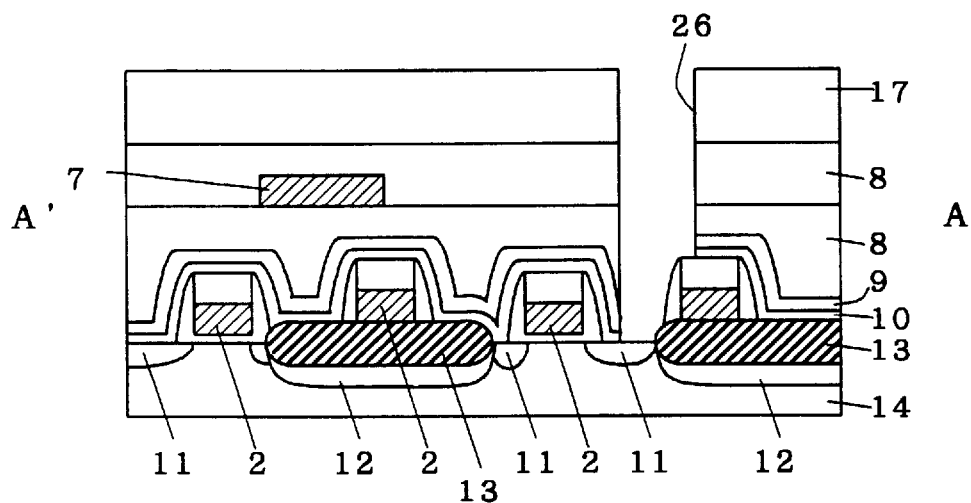
Figure 35:
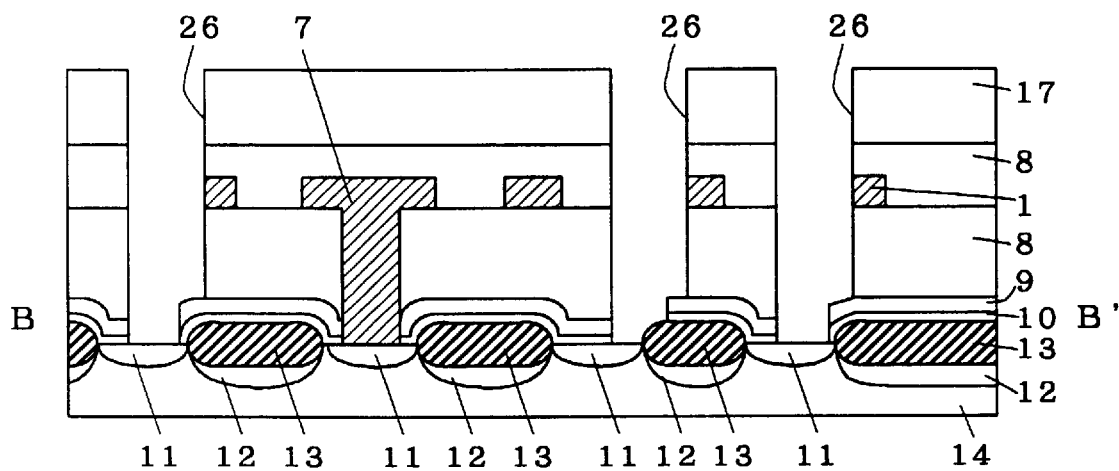

After the fabrication step shown in FIGS. 32 and 33, the etching stopper underlay insulative film 10 (SiO$_2$) is removed by RIE anisotropic etching, but the sidewall insulative film adjacent the word line 2 is left because of the etching rate, as illustrated in FIGS. 34 and 35.

Figure 36:
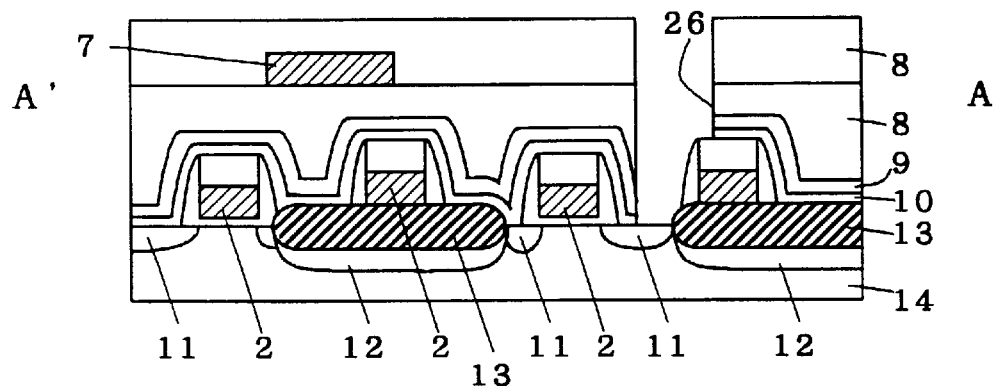
Figure 37:
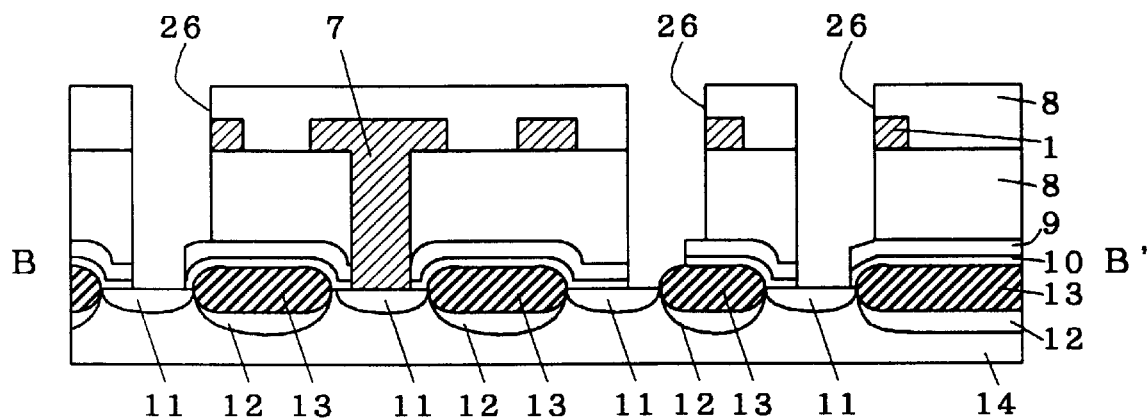

After the fabrication step shown in FIGS. 34 and 35, the photoresist 17 is removed by the O$_2$ plasma ashing process as illustrated in FIGS. 36 and 37.

After the fabrication step shown in FIGS. 36 and 37, an insulative film (SiO$_2$) is deposited on the surface of the semiconductor device and in the holes 26 by the CVD process. Then, RIE anisotropic SiO$_2$ etching is performed over the entire surface to form the sidewall insulative films 16, thereby forming the contact holes 18 as illustrated in FIGS. 38 and 39.

Figure 38:
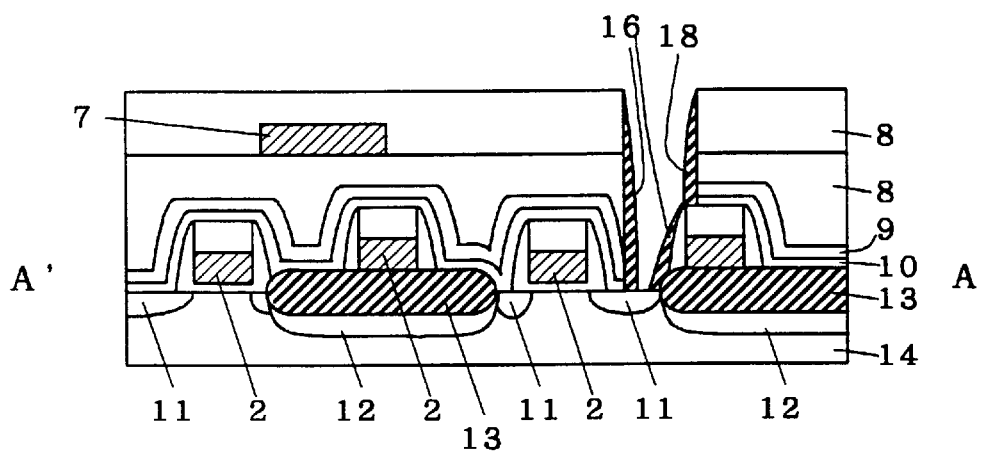
Figure 39:
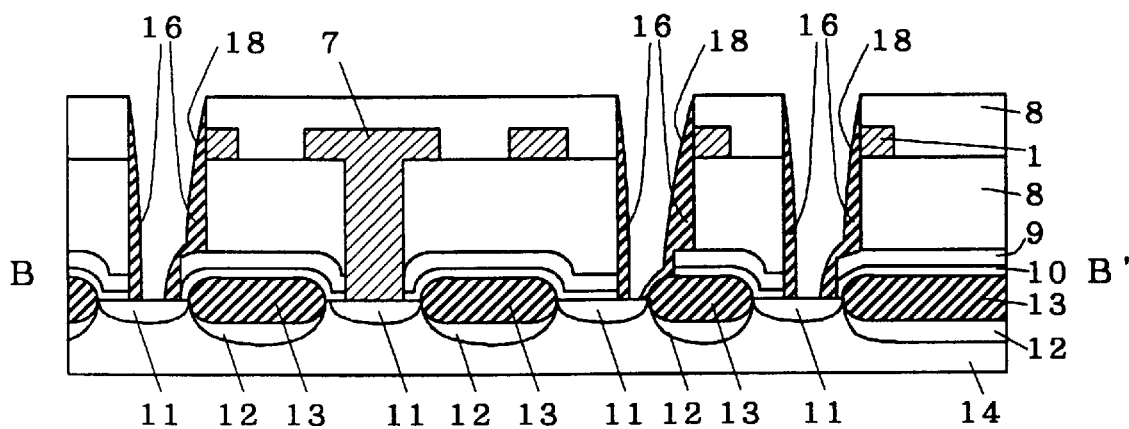
Figure 40:
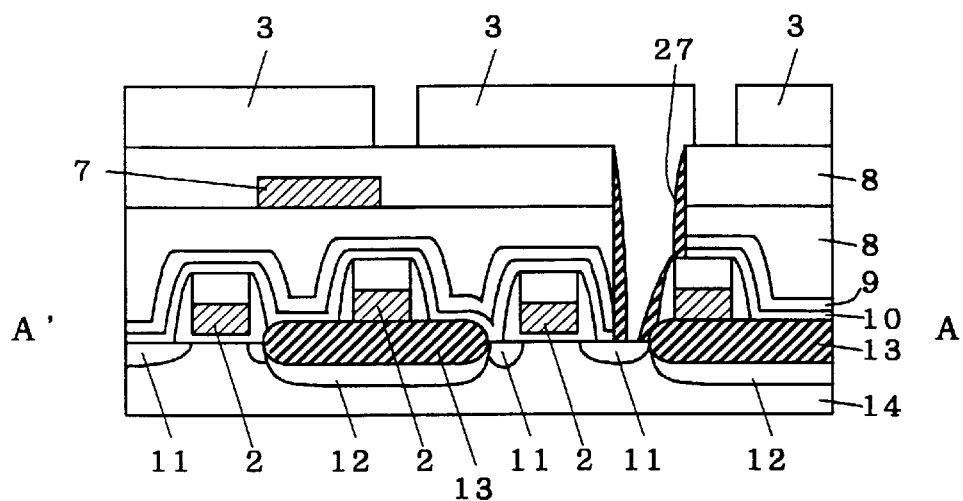
Figure 41:
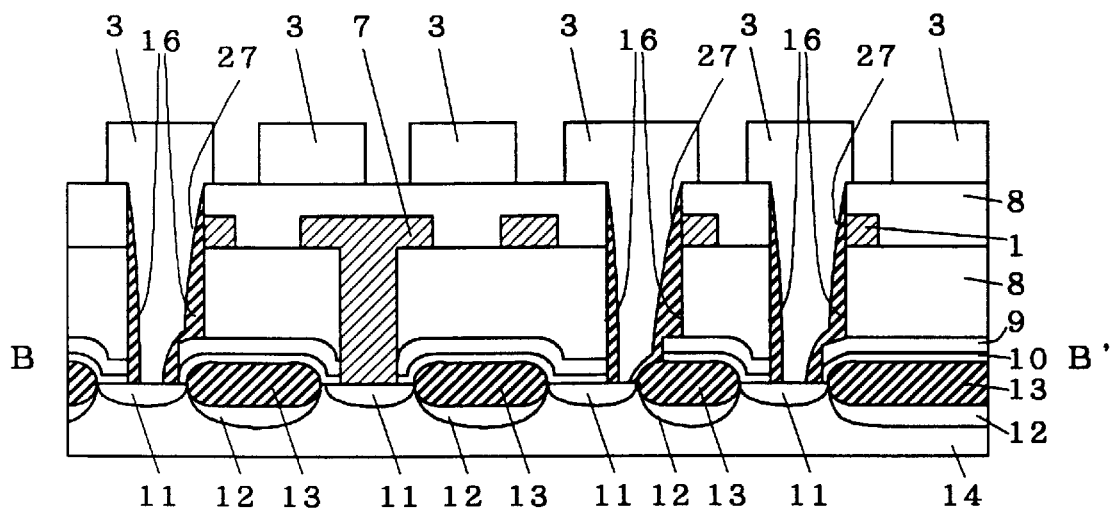

After the fabrication step shown in FIGS. 38 and 39, the contact holes 18 are filled with the storage nodes 3 as illustrated in FIGS. 40 and 41. The dielectric film and cell plate not shown are stacked to form the capacitor C (FIG. 19).

The dynamic RAM semiconductor device structure shown in FIGS. 40 and 41 is formed in this manner. The structure of the first preferred embodiment is characterized in that the alignment of the bit lines with the holes may be achieved while the parts of the bit lines 1 which are located in the holes are removed in a self-aligned manner as in the method according to the premise of the present invention, in that the etching stopper film 9 allows the alignment of the word lines with the holes without removing the gate electrodes, and in that the dynamic RAM semiconductor device having satisfactory electrical characteristics may be produced without partially removing the isolation insulative film 13.

The first preferred embodiment significantly differs from the premise of the present invention in the provision of the etching stopper film 9 and the etching stopper underlay insulative film 10 as illustrated in FIGS. 28 through 41. Such an arrangement allows the formation of the contact holes without the removal of the word lines in the dynamic RAM semiconductor device having at least two interconnect levels, particularly in the semiconductor device having the interconnect layers including the word lines (gate electrodes), as has been difficult in the past.

(Second Preferred Embodiment)

In the first preferred embodiment, it is not necessary to remove the word lines in the semiconductor device having at least two interconnect levels including the bit lines and the word lines to form the contact holes. The method of the first preferred embodiment, however, removes the parts of the bit lines which are located in the holes. When the bit lines are originally thin, the partial removal of the thin bit lines might result in disconnection and high wiring resistance of the bit lines.

The semiconductor device according to a second preferred embodiment of the present invention for solving the above described problem will be discussed below with reference to the drawings.

Figure 42:
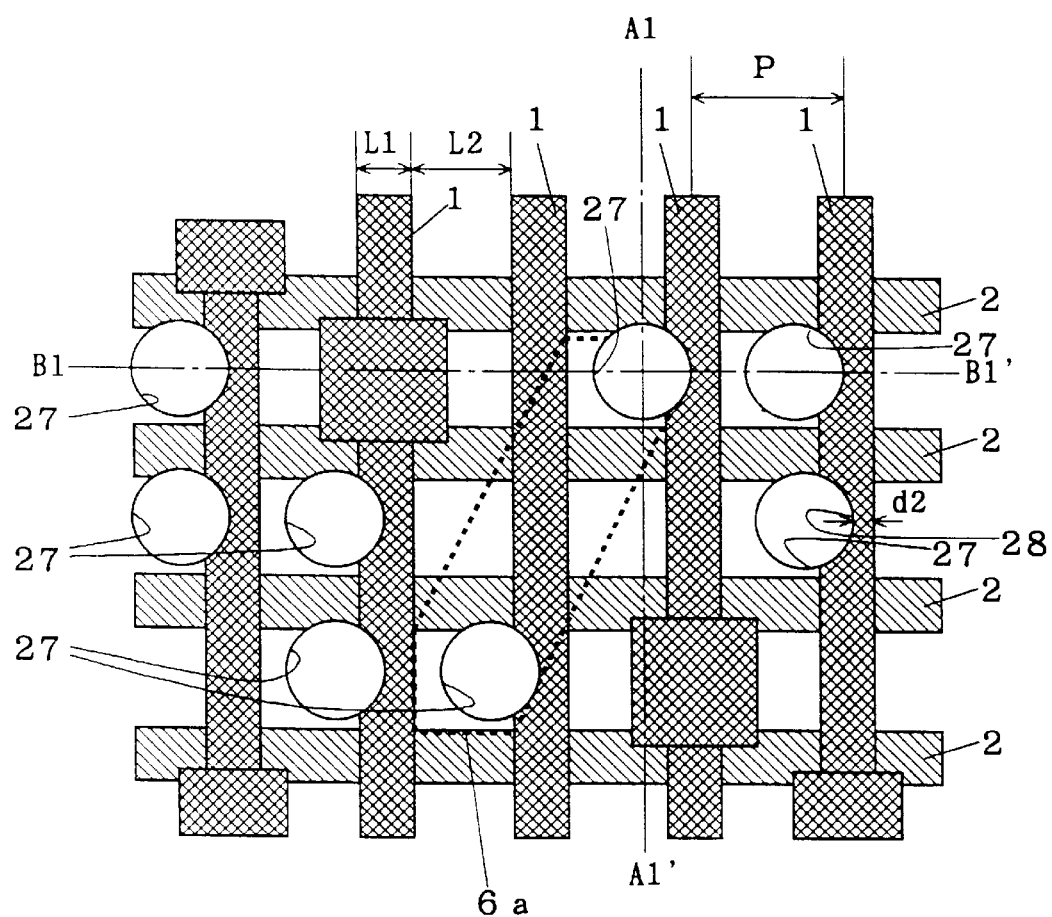
FIG. 42 is a plan view of a background art semiconductor device in the mask production stage.
Figure 43:
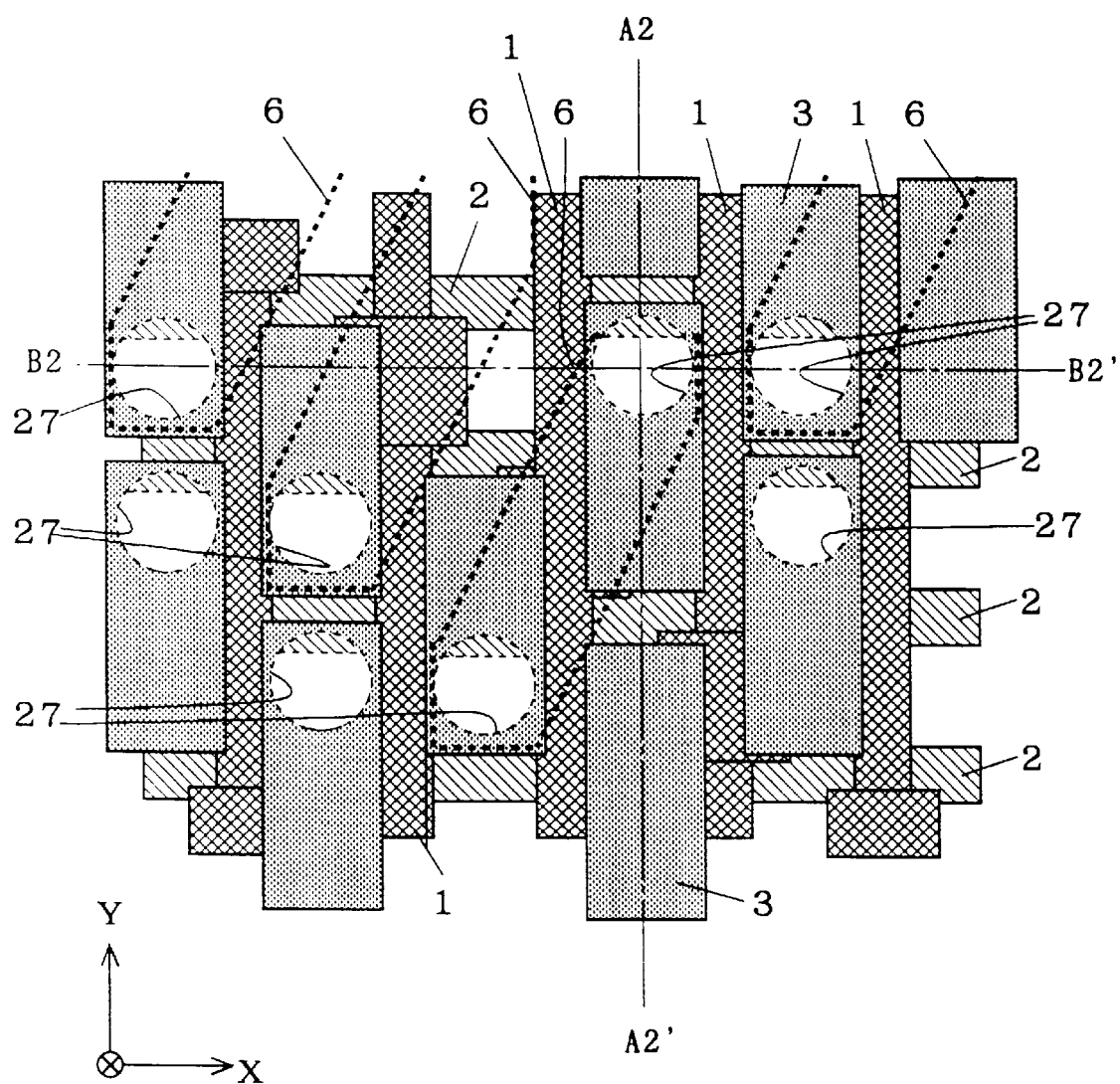
FIG. 43 is a plan view of the background art semiconductor device in the capacitor production stage.
Figure 44:
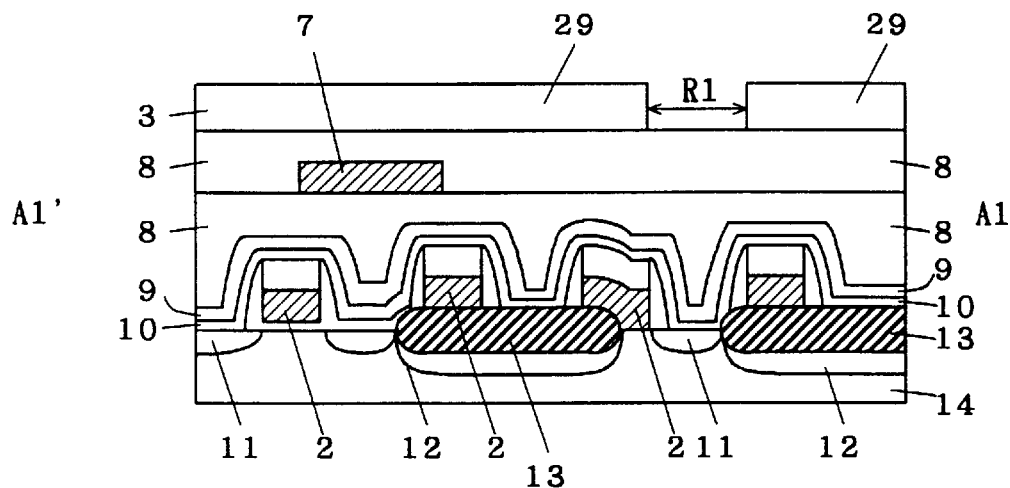
FIG. 44 is a cross-sectional view of the background art semiconductor device in the mask production stage taken along the line A1'–A1 of FIG. 42.
Figure 45:
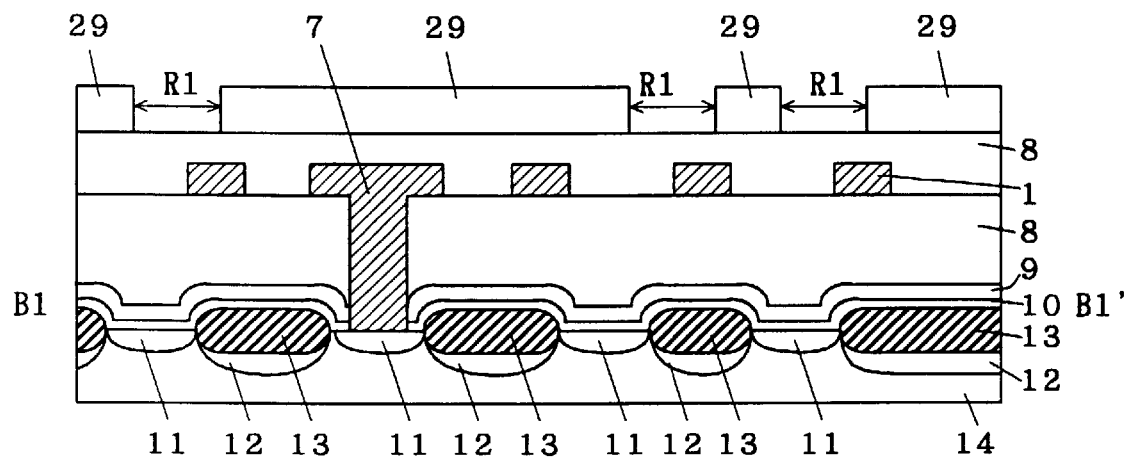
FIG. 45 is a cross-sectional view of the background art semiconductor device in the mask production stage taken along the line B1–B1' of FIG. 42.
Figure 46:
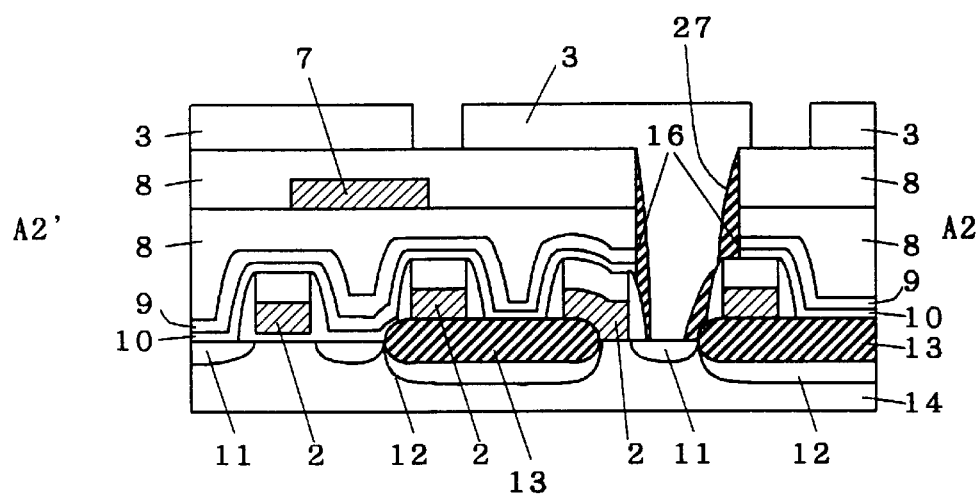
FIG. 46 is a cross-sectional view of the background art semiconductor device in the capacitor production stage taken along the line A2'–A2 of FIG. 43.
Figure 47:
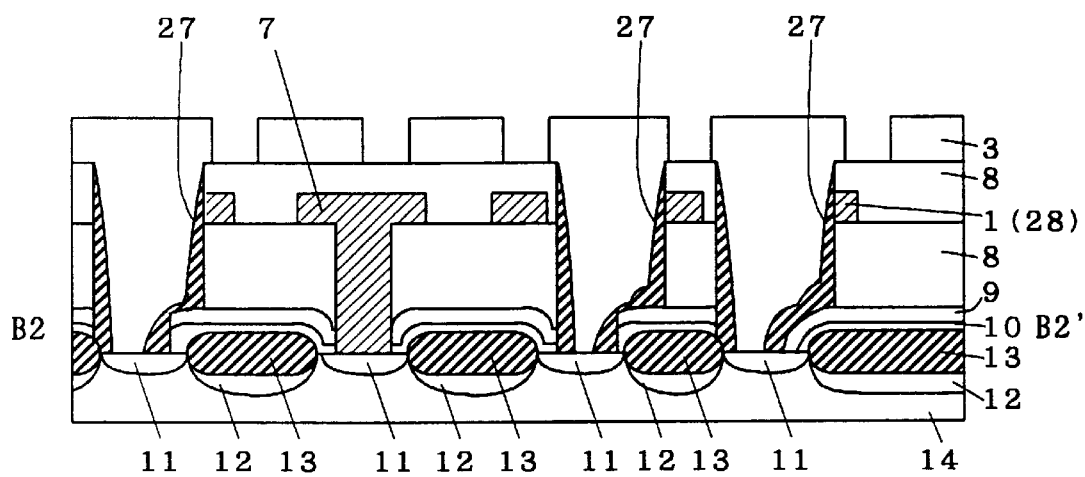
FIG. 47 is a cross-sectional view of the background art semiconductor device in the capacitor production stage taken along the line B2–B2' of FIG. 43.

FIG. 42 is a plan view of a background art semiconductor device in the mask production stage when the misalignment of the contact holes exists, the diameter of the contact holes is enlarged, and the bit lines are thinned. FIG. 43 is a plan view of the semiconductor device, similar to that of FIG. 42, in the capacitor production stage. FIGS. 44 and 45 are cross-sectional views taken along the lines A1'–A1 and B1–B1' of FIG. 43, respectively. FIGS. 46 and 47 are cross-sectional views taken along the lines A2'–A2 and B2–B2' of FIG. 43, respectively.

Figure 48:
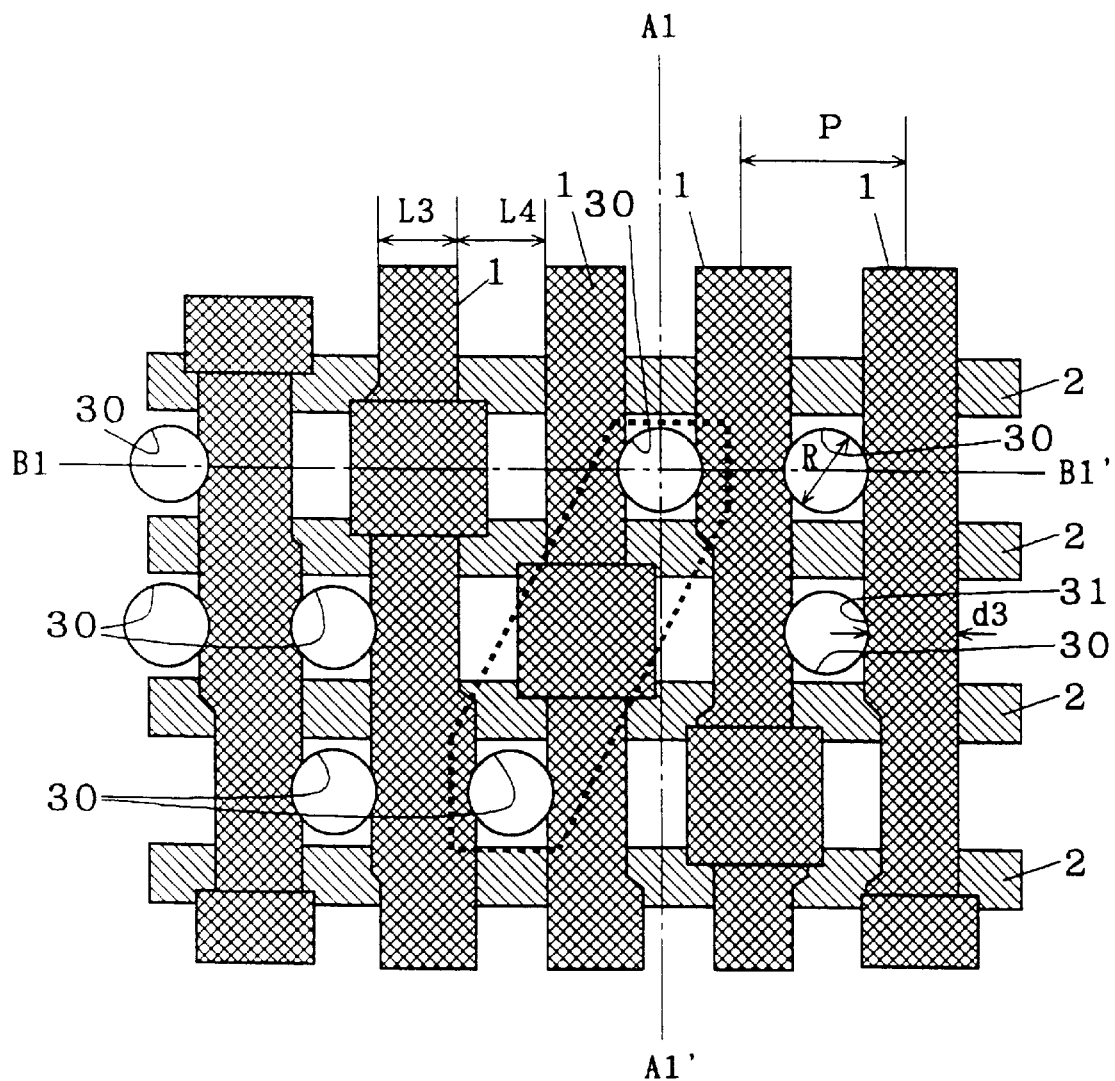
FIG. 48 is a plan view of the semiconductor device in the mask production stage according to a second preferred embodiment of the present invention.
Figure 49:
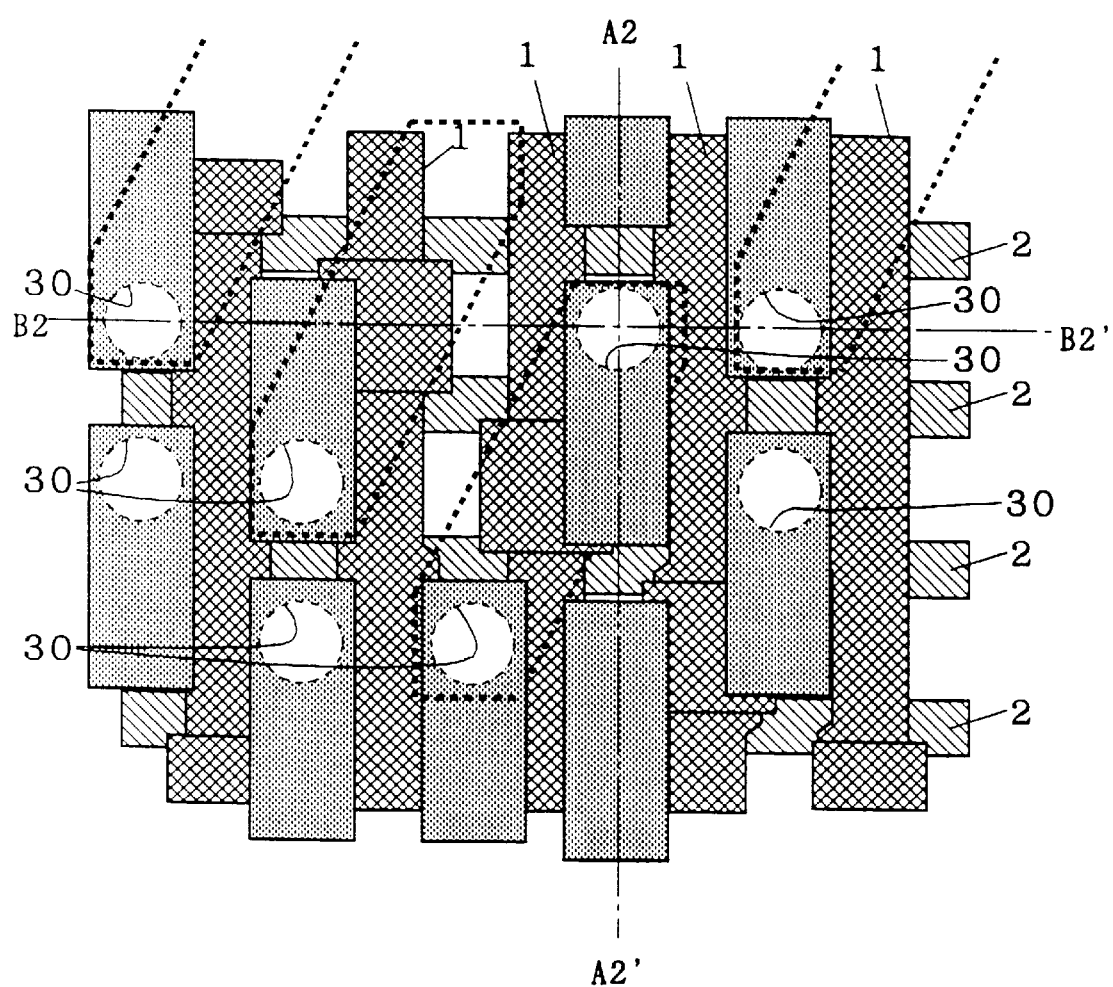
FIG. 49 is a plan view of the semiconductor device in the capacitor production stage according to the second preferred embodiment of the present invention.
Figure 51:
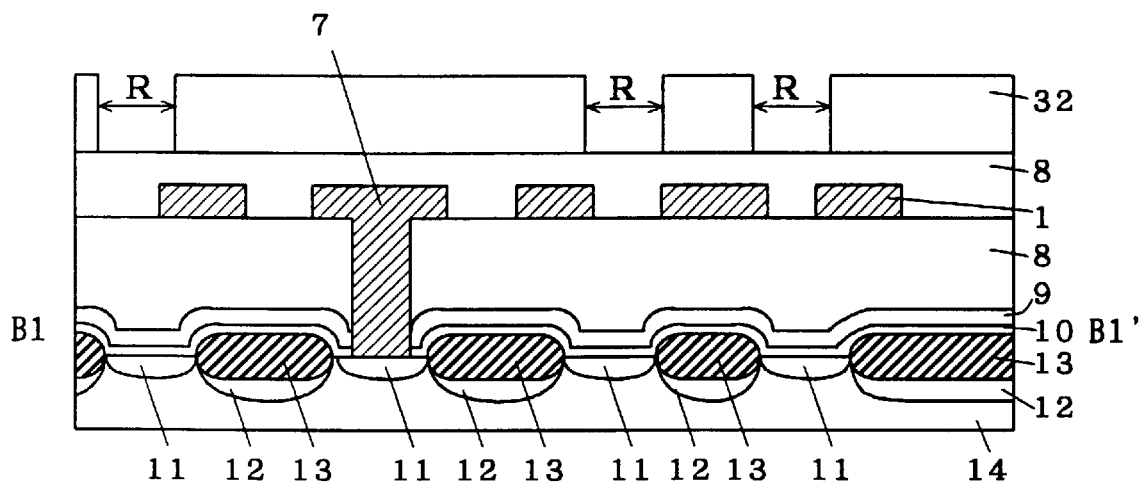
FIG. 51 is a cross-sectional view of the semiconductor device in the mask production stage taken along the line B1–B1' of FIG. 48 according to the second preferred embodiment of the present invention.
Figure 52:
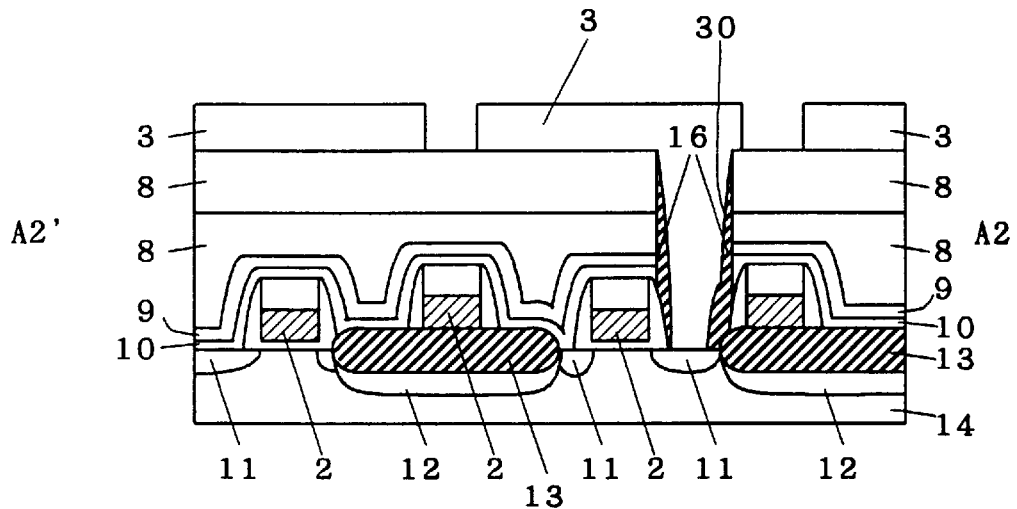
FIG. 52 is a cross-sectional view of the semiconductor device in the capacitor production stage taken along the line A2'–A2 of FIG. 49 according to the second preferred embodiment of the present invention.
Figure 53:
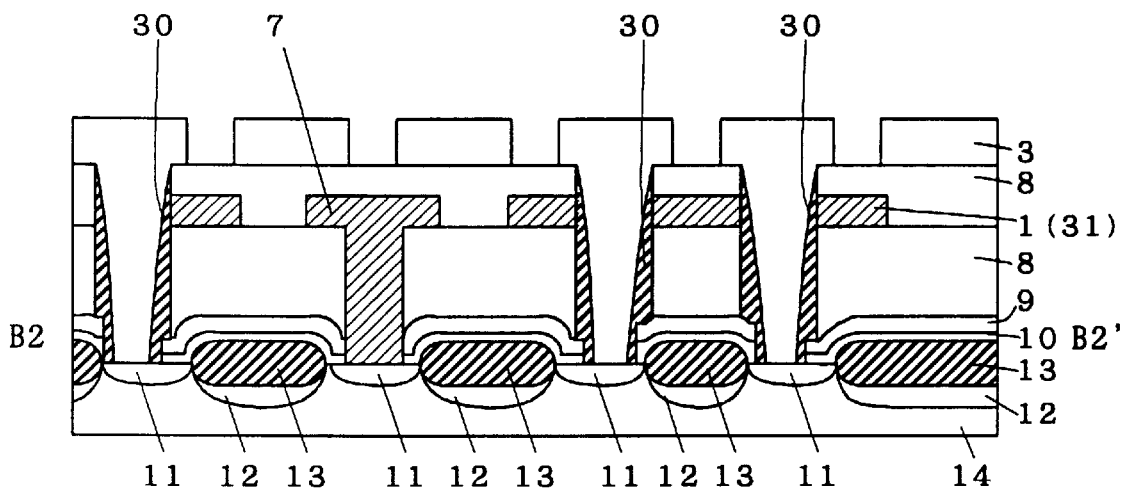
FIG. 53 is a cross-sectional view of the semiconductor device in the capacitor production stage taken along the line B2–B2' of FIG. 49 according to the second preferred embodiment of the present invention.

FIG. 48 is a plan view of the semiconductor device in the mask production stage according to the second preferred embodiment of the present invention when no misalignment of the contact holes exists, the diameter of the contact holes is not enlarged, and the bit lines are thinned. FIG. 49 is a plan view of the semiconductor device, similar to that of FIG. 48, in the capacitor production stage. FIGS. 51 and 52 are cross-sectional views taken along the lines A1'–A1 and B1–B1' of FIG. 48, respectively. FIGS. 52 and 53 are cross-sectional views taken along the lines A2–A2' and B2–B2' of FIG. 49, respectively.

Figure 54:
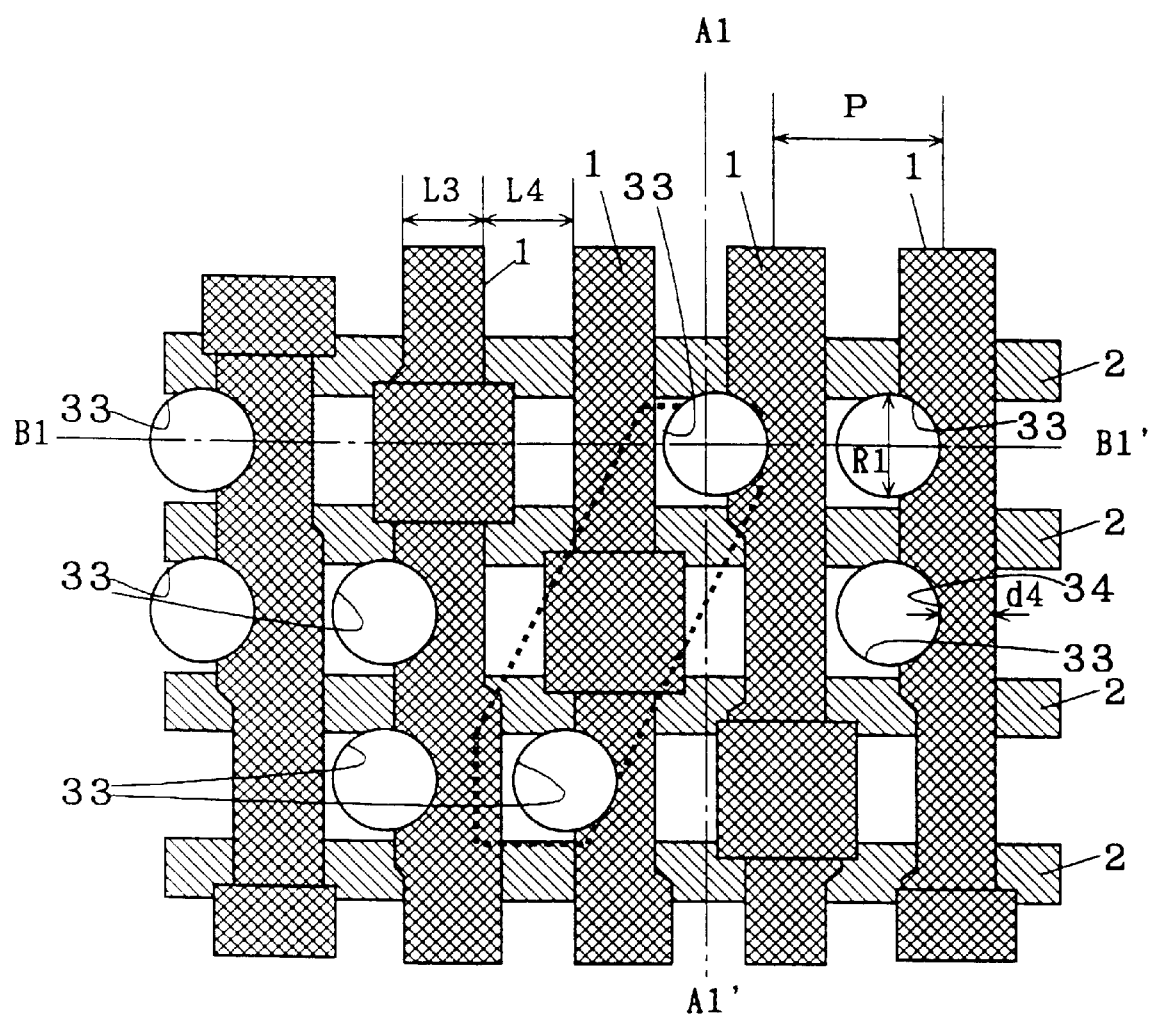
FIG. 54 is a plan view of the semiconductor device in the mask production stage according to the second preferred embodiment of the present invention.
Figure 55:
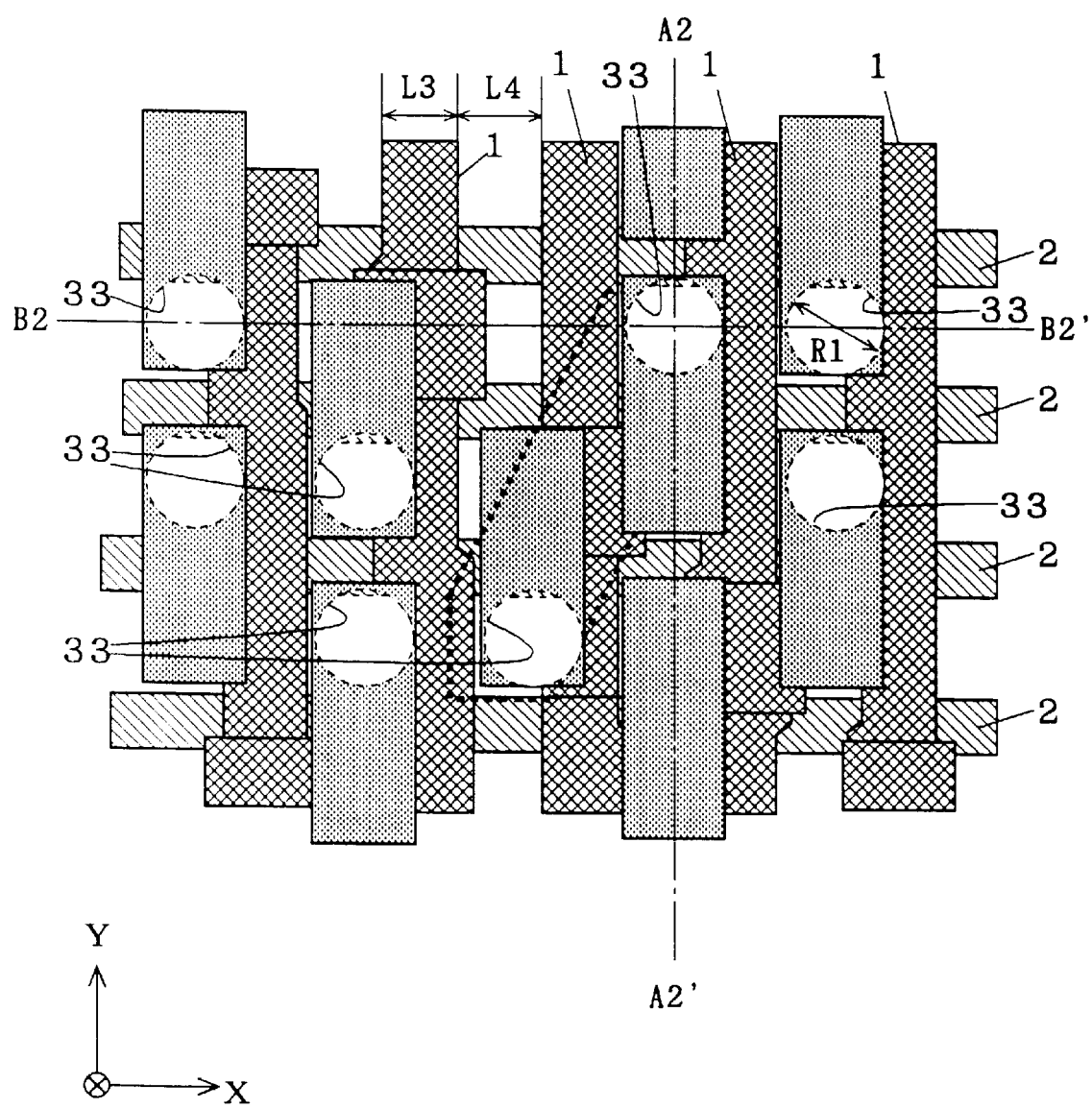
FIG. 55 is a plan view of the semiconductor device in the capacitor production stage according to the second preferred embodiment of the present invention.
Figure 56:
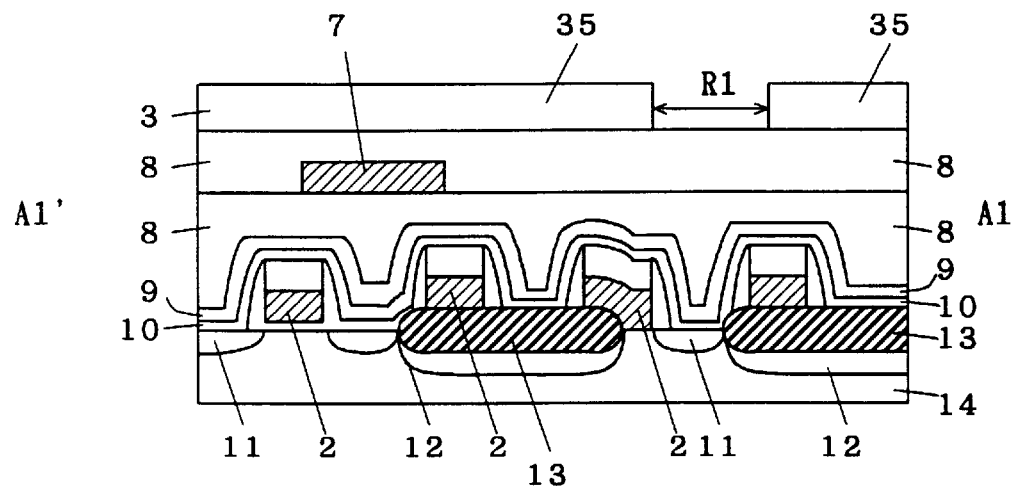
FIG. 56 is a cross-sectional view of the semiconductor device in the mask production stage taken along the line A1'–A1 of FIG. 54 according to the second preferred embodiment of the present invention.
Figure 57:
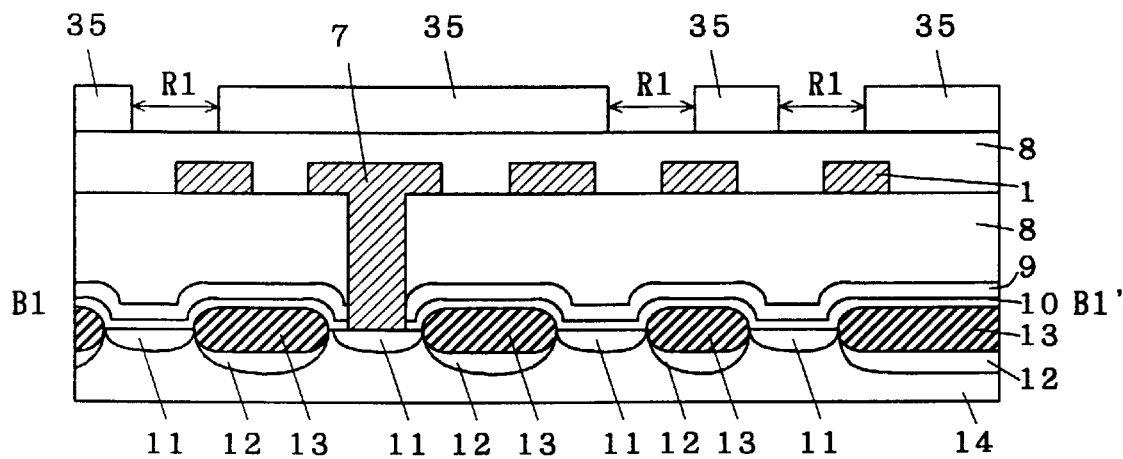
FIG. 57 is a cross-sectional view of the semiconductor device in the mask production stage taken along the line B1–B1' of FIG. 54 according to the second preferred embodiment of the present invention.
Figure 58:
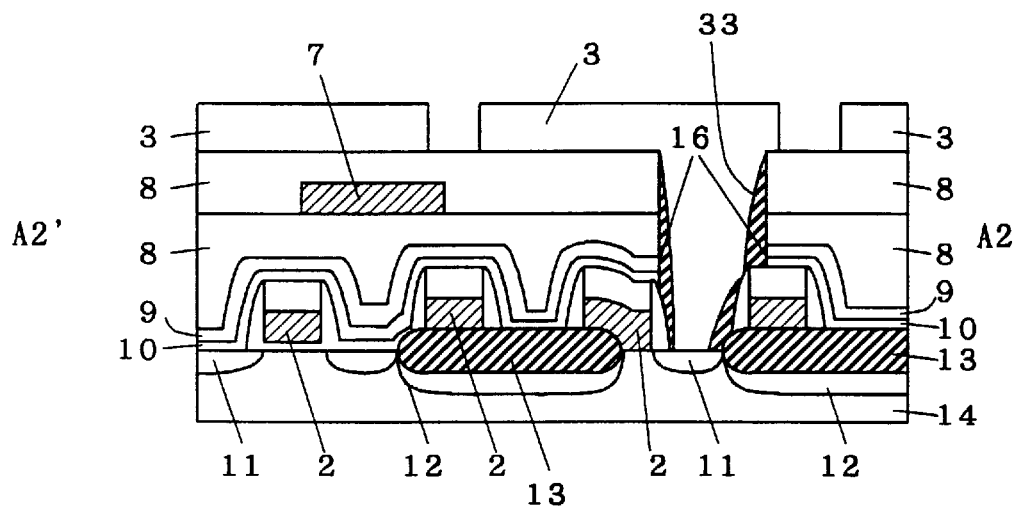
FIG. 58 is a cross-sectional view of the semiconductor device in the capacitor production stage taken along the line A2'–A2 of FIG. 55 according to the second preferred embodiment of the present invention.
Figure 59:
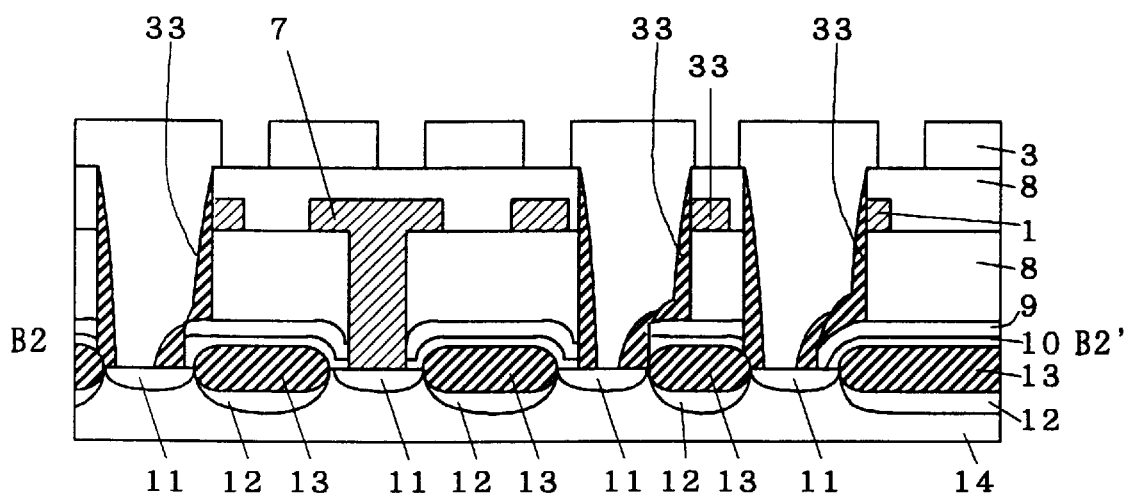
FIG. 59 is a cross-sectional view of the semiconductor device in the capacitor production stage taken along the line B2–B2' of FIG. 55 according to the second preferred embodiment of the present invention.
Figure 60:
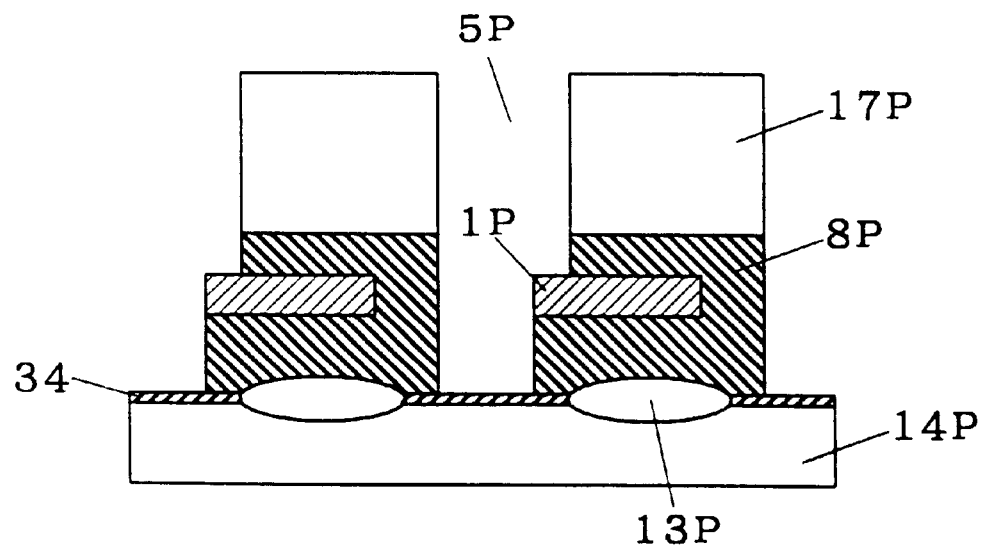
FIG. 60 through 63 are cross-sectional views illustrating the respective steps of the fabrication of a background art dynamic RAM semiconductor device.
Figure 61:
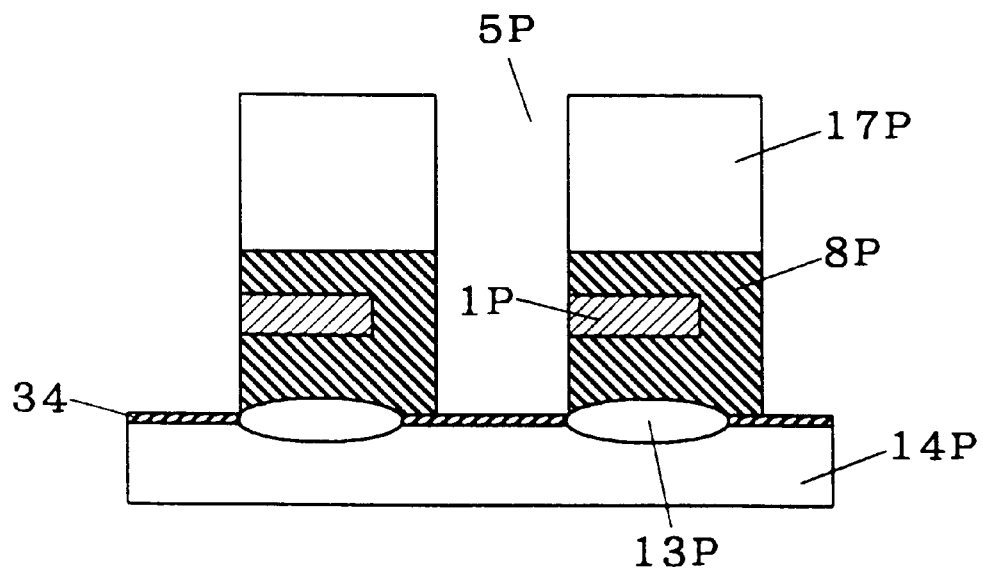
Figure 62:
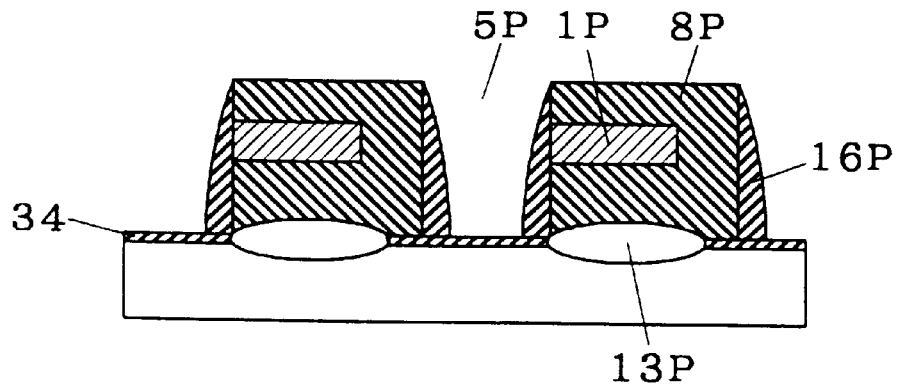
Figure 63:
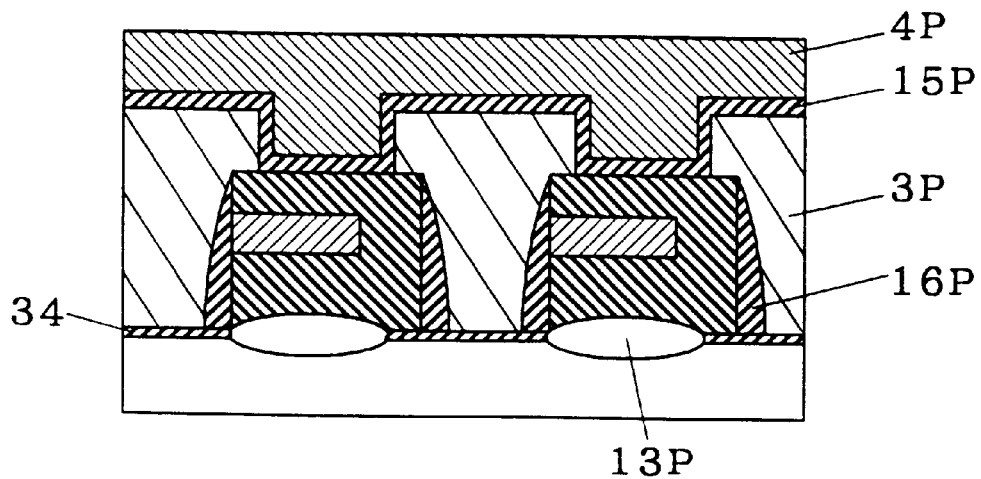

FIG. 54 is a plan view of the semiconductor device in the mask production stage according to the second preferred embodiment of the present invention when the misalignment of the contact holes exists, the diameter of the contact holes is enlarged, and the bit lines are thinned. FIG. 55 is a plan view of the semiconductor device, similar to that of FIG. 54, in the capacitor production stage. FIGS. 56 and 57 are cross-sectional views of the semiconductor device taken along the lines A1'–A1 and B1–B1' of FIG. 55, respectively. FIGS. 58 and 59 are cross-sectional views taken along the lines A2'–A2 and B2–B2' of FIG. 55, respectively.

Referring to FIG. 42, the semiconductor device wherein the misalignment of the contact holes exists, the diameter of the contact holes is enlarged, and the bit lines are thinned is discussed. The bit lines 1 having the width L1 are spaced the distance L2 from each other at the pitch P, as shown in FIG. 42. Contact holes 27 have a diameter R1, and parts 28 of the bit lines 1 which are thinned due to the misalignment in photolithography in the fabrication steps are present. The thinned parts 28 of the bit lines 1 have a width d2 which is less than the width d1 of the parts 19 of the first preferred embodiment shown in FIG. 26.

As illustrated in FIG. 43, the use of the technique of the first preferred embodiment allows the unremoved word lines 2 to be present under the contact holes 27.

With reference to FIGS. 44 and 45, the opening diameter R1 of a photoresist 29 is enlarged in the mask production stage. The cross sections of the contact holes 27 fabricated by the fabrication method of the first preferred embodiment and filled with the storage nodes 3 are shown in FIGS. 46 and 47. As illustrated in FIG. 46, the word line 2 in the contact hole 27 remains unremoved. The bit lines 1 have the parts 28 of extremely thinned width by partial removal thereof as illustrated in FIG. 47. The contact holes 27 are formed in such a manner that the etching stopper film 9 and the etching stopper underlay insulative film 10 extend toward the inside of the contact holes 27 by the amount of the removal.

In this manner, the contact holes 27 for the storage nodes 3 are out of alignment with the bit lines 1 and the word lines 2, the diameter of the contact holes 27 is enlarged, and the width of the bit lines 1 is reduced. When the process of removing the exposed parts of the bit lines 1 in the holes 26 in the first preferred embodiment shown in FIG. 33 is applied to such conditions, the extremely thin parts 28 of the bit lines 1 shown in FIG. 47 are created which increase the likelihood of errors such as disconnection and high wiring resistance.

The second preferred embodiment proposes a method of increasing the width of the bit lines 1. In general, the width of the bit lines 1 shown in FIG. 42 equals the pitch P of the bit lines 1 minus the sum of the diameter of the contact holes 27 for the storage nodes 3, an alignment accuracy allowance, and a dimension accuracy allowance so that the contact holes 27 are prevented from contacting the word lines 2 (gate electrodes) and the bit lines 1.

Ideally, it would be desirable to position the holes in non-overlapping relation to the bit lines 1 and the word lines 2 in the photolithographic process. Actually, the holes cannot always be so positioned for reasons of accuracy. In such a case, when the holes are formed by the method of the first preferred embodiment, the bit lines 1 are partially removed in a self-aligned manner to conform to the hole diameter. It is not necessary to consider the positioning of the bit lines 1 and the holes in non-overlapping relation when semiconductor devices are designed, but the above described extremely thinned parts of the bit lines 1 are created.

In the second preferred embodiment, the width of the bit lines 1 is maximized within the range allowed by photolithographic resolution as shown in the plan view of FIG. 48 illustrating the mask production stage. The bit lines 1 have a width L3 greater than the width L2, a spacing L4, and the pitch P. Contact holes 30 have the normal diameter R. Referring to FIG. 48, the bit lines 1 are partially removed in the contact holes 30 to create parts 31 of a reduced width d3.

It will be understood from the arrangement of FIG. 49 wherein no lines appear in the contact holes 30 that the bit lines 1 are partially removed and the word lines 2 are not affected.

Figure 50:
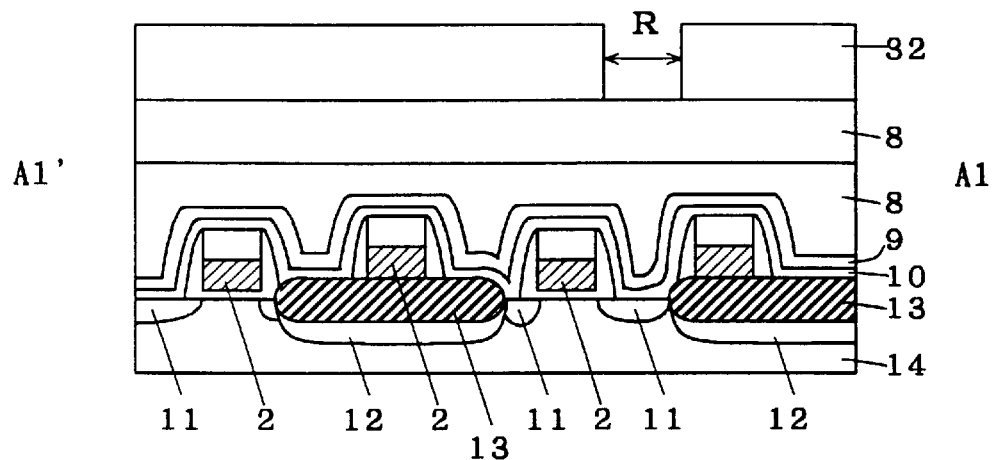
FIG. 50 is a cross-sectional view of the semiconductor device in the mask production stage taken along the line A1'–A1 of FIG. 48 according to the second preferred embodiment of the present invention.

As shown in FIGS. 50 and 51, a photoresist 32 having an opening of the normal diameter R is formed in the mask production stage.

The contact holes 30 have the diameter R at this time, and the width L3 of the bit lines 1 is enlarged so that the spacing L4 of the bit lines 1 is less than the diameter R. This causes the contact holes 30 to overlap the bit lines 1 when ideal patterning is performed.

Referring to FIG. 52, the word lines 2 (gate electrodes) are not removed when the holes are formed.

After the capacitors are produced, the parts 31 of the bit lines 1 which have the reduced width are present as shown in FIG. 53. It is apparent from the fabrication steps of the first preferred embodiment, the etching stopper film 9 and the etching stopper underlay insulative film 10 extend toward the sidewall insulative films 16 by the amount of the removal of the bit lines 1. FIG. 49 illustrates the semiconductor device in an ideal state wherein the pattern is formed as designed. In the arrangement of FIG. 49, the contact holes 30 for the storage nodes 3 are not shorted to the bit lines 1 and the word lines 2 (transfer gates).

The semiconductor device wherein the misalignment of the contact holes exists and the diameter of the contact holes is enlarged in the photolithographic process shown in FIG. 48 is described below.

Referring to FIG. 54, the misalignment of contact holes 33 exists, and the widths of the bit lines 1 and word lines 2 are reduced to create the thinned parts 34 of the bit lines 1. The thinned parts 34 have a width d4. The bit lines 1 have the width L3 and the spacing L4 which are equal to those shown in FIG. 48. The contact holes 33 have the diameter R1 greater than the normal diameter R.

The parts of the bit lines 1 which appear in the contact holes 33 are removed, but the word lines 2 remain unremoved therein as shown in FIG. 55.

With reference to FIGS. 56 and 57, a photoresist 35 having an opening of the enlarged diameter R1 is formed in the mask production stage.

The contact holes 33 are filled with the storage nodes 3 in the capacitor production stage as depicted in FIGS. 58 and 59.

In the second preferred embodiment, as above described, the greater width of the bit lines 1 than the normal width may ensure a sufficiently low resistance of the thinned parts 34 of the bit lines 1 which are other than the removed parts in the holes. The problem of insufficient alignment accuracy occurs when an extremely fine pattern is to be transferred. Solving the problem allows finer patterns to be formed and readily achieves a high degree of integration of the device.

While the invention has been described in detail, the foregoing description is in all aspects illustrative and not restrictive. It is understood that numerous other modifications and variations can be devised without departing from the scope of the invention.

I claim:

1. A semiconductor device having a structure of at least two interconnect levels comprising:

a semiconductor substrate serving as a base;

a first interconnect wire provided above a surface of said semiconductor substrate;

an etching stopper film provided over said first interconnect wire for covering at least an upper surface of said first interconnect wire;

a second interconnect wire provided above said etching stopper film;

a hole formed above said surface of said semiconductor substrate by etching;

said second interconnect wire and said etching stopper film having parts located in said hole, said parts of said second interconnect wire and said etching stopper film being removed by said etching;

said first interconnect wire having a part located in said hole, said part of said first interconnect wire remaining unremoved by said etching; and a sidewall insulative film provided on a side surface of said hole.

2. The semiconductor device of claim 1, further comprising:

an underlay insulative film provided on a lower surface of said etching stopper film.

3. The semiconductor device of claim 2, wherein a part of said underlay insulative film which is located in said hole is removed by said etching.

4. The semiconductor device of claim 2, wherein said second interconnect wire includes a plurality of interconnect wires arranged at a predetermined pitch, and wherein the width of said plurality of interconnect wires is increased up to a size which permits the spacing between said plurality of interconnect wires to be less than the diameter of said hole.

5. The semiconductor device of claim 1, said semiconductor device including a dynamic RAM, wherein said hole is filled with a storage node for a capacitor, and wherein said first interconnect wire and said second interconnect wire are a word line and a bit line, respectively.

* * * * *